(12) United States Patent
Hwang et al.

(10) Patent No.: US 10,275,075 B2
(45) Date of Patent: Apr. 30, 2019

(54) ORGANIC LIGHT EMITTING DISPLAY DEVICE

(71) Applicant: LG Display Co., Ltd., Seoul (KR)

(72) Inventors: JongHee Hwang, Goyang-si (KR); KiDuk Kim, Paju-si (KR); EunJung Kim, Seoul (KR)

(73) Assignee: LG Display Co., Ltd., Seoul (KR)

( * ) Notice: Subject to any disclaimer, the term of this patent is extended or adjusted under 35 U.S.C. 154(b) by 313 days.

(21) Appl. No.: 15/368,502

(22) Filed: Dec. 2, 2016

(65) Prior Publication Data
US 2018/0095582 A1   Apr. 5, 2018

(30) Foreign Application Priority Data
Sep. 30, 2016 (KR) ........................ 10-2016-0127165

(51) Int. Cl.
*G06F 3/041* (2006.01)
*G06F 3/044* (2006.01)
*H01L 27/32* (2006.01)

(52) U.S. Cl.
CPC ............ *G06F 3/0416* (2013.01); *G06F 3/044* (2013.01); *G06F 3/0412* (2013.01); *G06F 3/0414* (2013.01); *H01L 27/322* (2013.01); *H01L 27/323* (2013.01); *H01L 27/3276* (2013.01); *G06F 2203/04104* (2013.01); *G06F 2203/04105* (2013.01); *G06F 2203/04111* (2013.01); *G06F 2203/04112* (2013.01)

(58) Field of Classification Search
CPC combination set(s) only.
See application file for complete search history.

(56) References Cited

U.S. PATENT DOCUMENTS

| | | | |
|---|---|---|---|
| 2012/0313860 A1* | 12/2012 | Hashimura | ............ B82Y 15/00 345/173 |
| 2013/0021289 A1 | 1/2013 | Chen et al. | |
| 2013/0082970 A1* | 4/2013 | Frey | ...................... G06F 3/0414 345/173 |
| 2014/0218328 A1 | 8/2014 | Haapakoski et al. | |
| 2014/0375938 A1* | 12/2014 | Meyers | ............ G02F 1/133308 349/122 |
| 2015/0153942 A1 | 6/2015 | Kim et al. | |
| 2015/0355771 A1 | 12/2015 | Watazu et al. | |
| 2016/0117034 A1 | 4/2016 | Day | |

(Continued)

FOREIGN PATENT DOCUMENTS

| | | |
|---|---|---|
| EP | 2372506 | 10/2011 |
| WO | WO 2012176624 | 12/2012 |
| WO | WO 2015146367 | 10/2015 |

*Primary Examiner* — Jennifer Mehmood
*Assistant Examiner* — Deeprose Subedi
(74) *Attorney, Agent, or Firm* — Fenwick & West LLP

(57) ABSTRACT

Disclosed is an organic light emitting display device including an encapsulation layer covering a pixel array layer provided on a substrate and a cover window coupled to a touch sensing layer. The touch sensing layer may include a first touch electrode layer provided on the encapsulation layer, a second touch electrode layer provided on the first touch electrode layer, and a pressure reaction member provided between the first touch electrode layer and the second touch electrode layer. Electrical characteristic of the pressure reaction member may be changed according to force applied to the pressure reaction member.

20 Claims, 12 Drawing Sheets

(56) References Cited

U.S. PATENT DOCUMENTS

| | | | |
|---|---|---|---|
| 2016/0179276 A1 | 6/2016 | Nathan et al. | |
| 2017/0075493 A1* | 3/2017 | Lee | G06F 3/0418 |
| 2017/0228075 A1* | 8/2017 | Lin | G06F 3/0412 |
| 2017/0269751 A1* | 9/2017 | Cho | G02F 1/13338 |
| 2017/0324058 A1* | 11/2017 | Min | H01L 51/524 |
| 2018/0046304 A1* | 2/2018 | Kim | G06F 3/0414 |

\* cited by examiner

ORGANIC LIGHT EMITTING DISPLAY DEVICE

CROSS-REFERENCE TO RELATED APPLICATIONS

This application claims the benefit of Republic of Korea Patent Application No. 10-2016-0127165 filed on Sep. 30, 2016, which is hereby incorporated by reference as if fully set forth herein.

BACKGROUND

Related Field

One or more embodiments disclosed herein relate to an organic light emitting display device including a touch panel.

Discussion of the Related Art

A touch panel is a type of input device, which is applied to an image display device such as liquid crystal display (LCD) device, field emission display (FED), plasma display panel (PDP), electroluminescent display (ELD), electrophoretic display (EPD), organic light emitting display device, etc., and enables a user to input information by directly touching a screen with a finger, a pen, or the like while looking at the screen of the image display device.

Recently, the touch panels are used as input devices of various products such as televisions (TVs), notebook computers, monitors, etc., in addition to portable electronic devices such as electronic notebooks, e-books, portable multimedia players (PMPs), navigation devices, ultra-mobile personal computers (UMPCs), mobile phones, smartphones, smartwatches, tablet personal computers (PCs), watch phones, mobile communication terminals, etc.

Recently, as a user interface environment such as applications requiring touch information about a force touch is established, organic light emitting display devices for sensing the force touch are being researched and developed. For example, WO 2010/026515 discloses an organic light emitting diode (OLED) device including a capacitive proximity sensing means that senses a force touch of a user by sensing a variation of a capacitance caused by a user touch through a mechanical element disposed between an OLED means and a mounting structure. However, in the OLED device of the related art, a thickness increases due to the mechanical element disposed between the OLED means and the mounting structure.

SUMMARY

An organic light emitting display device disclosed herein substantially obviates one or more problems due to limitations and disadvantages of the related art.

Advantageously, an organic light emitting display device includes a touch panel and has a thin thickness.

In addition, an organic light emitting display device integrated with a touch panel senses a touch position and a touch force.

Additional advantages and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

In one or more embodiments, an organic light emitting display device includes an encapsulation layer covering a pixel array layer provided on a substrate and a cover window coupled to a touch sensing layer, wherein the touch sensing layer includes a first touch electrode layer provided on the encapsulation layer, a second touch electrode layer provided on the first touch electrode layer, and a pressure reaction member between the first touch electrode layer and the second touch electrode layer, electrical characteristic of the pressure reaction member changed according to force applied to the pressure reaction member. The pressure reaction member may include a piezoelectric material or a piezoresistive material.

In one or more embodiments, an organic light emitting display device comprises: a display layer including: a substrate, a pixel array layer on the substrate, the pixel array layer including a plurality of pixels, each of the plurality of pixels including a thin film transistor (TFT) and an organic light emitting diode, and an encapsulation layer covering the pixel array layer; a cover window; and a touch sensing layer directly disposed on the display layer, the touch sensing layer disposed between the display layer and the cover window. The touch sensing layer may comprise: a first touch electrode layer directly on the display layer, a second touch electrode layer between the first touch electrode layer and the cover window, and a pressure reaction member between the first touch electrode layer and the second touch electrode layer, electrical characteristic of the pressure reaction member changed according to force applied to the pressure reaction member.

In one or more embodiments, the organic light emitting display device further comprises a touch driving circuit configured to determine force of a touch on the cover window according to a change in the electrical characteristic of the pressure reaction member associated with the touch.

In one or more embodiments, the pressure reaction member comprises a piezoelectric material or a piezoresistive material. The piezoelectric material may comprise at least one of lead zirconate titanate (PZT), $BaTiO_3$, polyvinylidene difluoride (PVDF), and parylene-C. The piezoresistive material may comprise a polymer and a conductive filler. The conductive filler may comprise at least one of nickel (Ni), copper (Cu), silver (Ag), aluminum (Al), iron (Fe), vanadium oxide ($V_2O_3$), titanium oxide (TiO), carbon black, graphite, graphene, and carbon nano tube (CNT).

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiments of the invention and together with the description serve to explain the principle of the invention. In the drawings.

DETAILED DESCRIPTION

Figure 1:
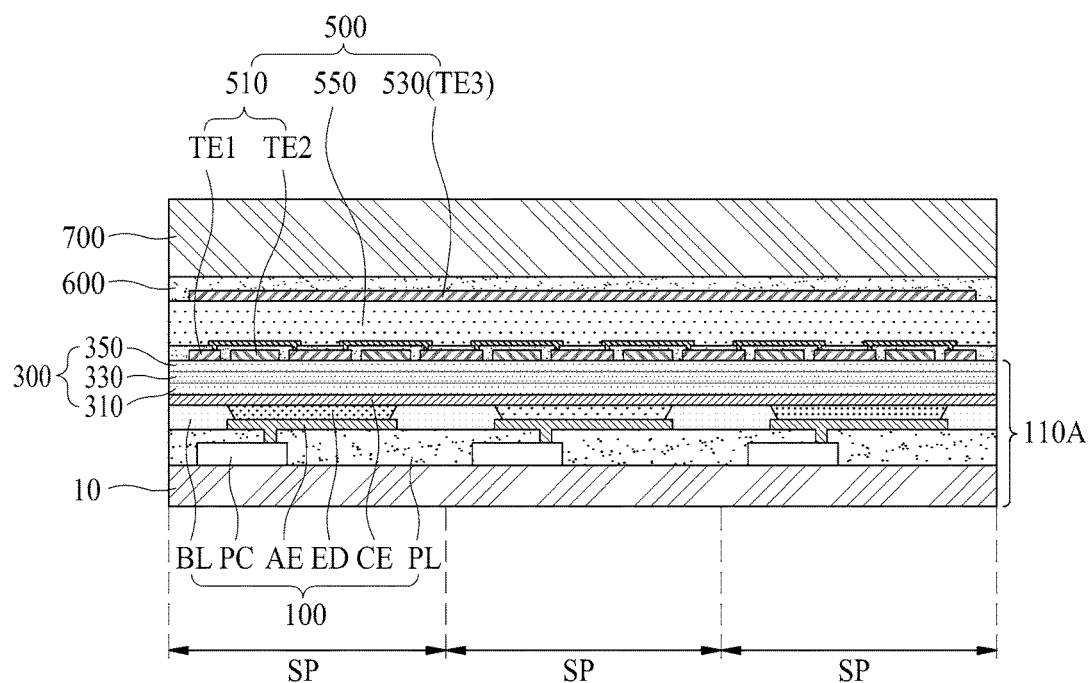
FIG. 1 is a cross-sectional view for describing an organic light emitting display device according to an embodiment.

Reference will now be made in detail to the exemplary embodiments of the present invention, examples of which are illustrated in the accompanying drawings. Wherever possible, the same reference numbers will be used throughout the drawings to refer to the same or like parts.

Advantages and features of the present invention, and implementation methods thereof will be clarified through following embodiments described with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Further, the present invention is only defined by scopes of claims.

A shape, a size, a ratio, an angle, and a number disclosed in the drawings for describing embodiments of the present invention are merely an example, and thus, the present invention is not limited to the illustrated details. Like reference numerals refer to like elements throughout. In the following description, when the detailed description of the relevant known function or configuration is determined to unnecessarily obscure the important point of the present invention, the detailed description will be omitted.

In a case where 'comprise', 'have', and 'include' described in the present specification are used, another part may be added unless 'only~' is used. The terms of a singular form may include plural forms unless referred to the contrary.

In construing an element, the element is construed as including an error range although there is no explicit description.

In describing a position relationship, for example, when a position relation between two parts is described as 'on~', 'over~', 'under~', and 'next~', one or more other parts may be disposed between the two parts unless 'just' or 'direct' is used.

In describing a time relationship, for example, when the temporal order is described as 'after~', 'subsequent~', 'next~', and 'before~', a case which is not continuous may be included unless 'just' or 'direct' is used.

It will be understood that, although the terms "first", "second", etc. may be used herein to describe various elements, these elements should not be limited by these terms. These terms are only used to distinguish one element from another. For example, a first element could be termed a second element, and, similarly, a second element could be termed a first element, without departing from the scope of the present invention.

A first horizontal axis direction, a second horizontal axis direction, and a vertical axis direction should not be construed as only a geometric relationship where a relationship therebetween is vertical, and may denote having a broader directionality within a scope where elements of the present invention operate functionally.

The term "at least one" should be understood as including any and all combinations of one or more of the associated listed items. For example, the meaning of "at least one of a first item, a second item, and a third item" denotes the combination of all items proposed from two or more of the first item, the second item, and the third item as well as the first item, the second item, or the third item.

Features of various embodiments of the present invention may be partially or overall coupled to or combined with each other, and may be variously inter-operated with each other and driven technically as those skilled in the art can sufficiently understand. The embodiments of the present invention may be carried out independently from each other, or may be carried out together in co-dependent relationship.

Hereinafter, exemplary embodiments of an organic light emitting display device according to the present invention will be described in detail with reference to the accompanying drawings. In the specification, in adding reference numerals for elements in each drawing, it should be noted that like reference numerals already used to denote like elements in other drawings are used for elements wherever possible. In the following description, when the detailed description of the relevant known function or configuration is determined to unnecessarily obscure the important point of the present invention, the detailed description will be omitted.

Figure 2:
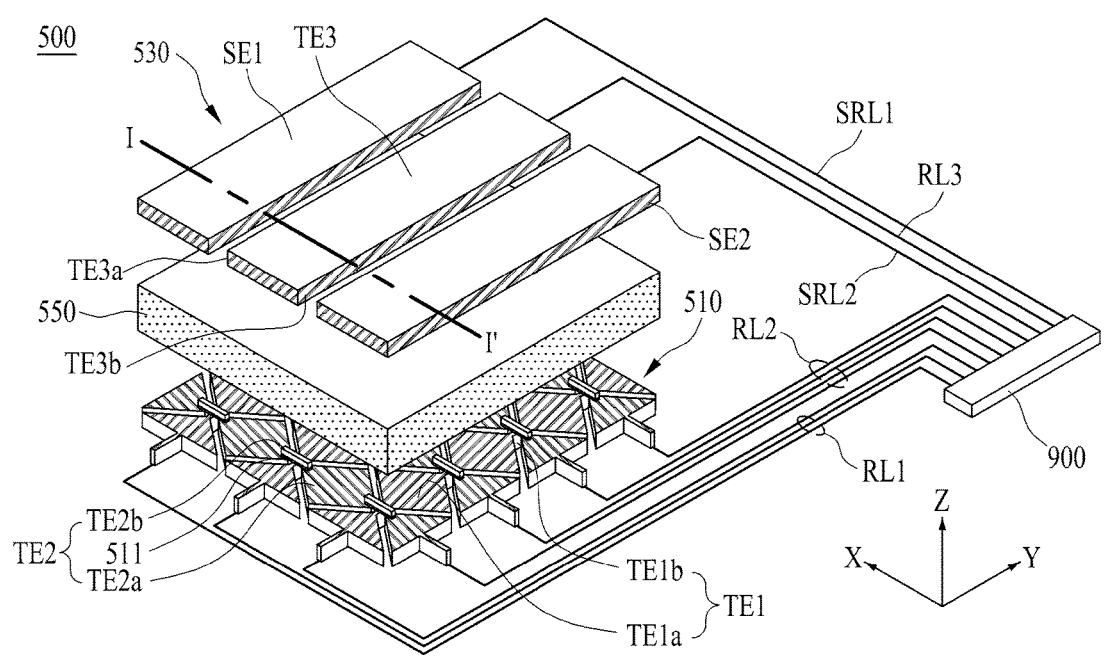
FIG. 2 is a diagram for describing a configuration of a touch sensing layer illustrated in FIG. 1.
Figure 3:
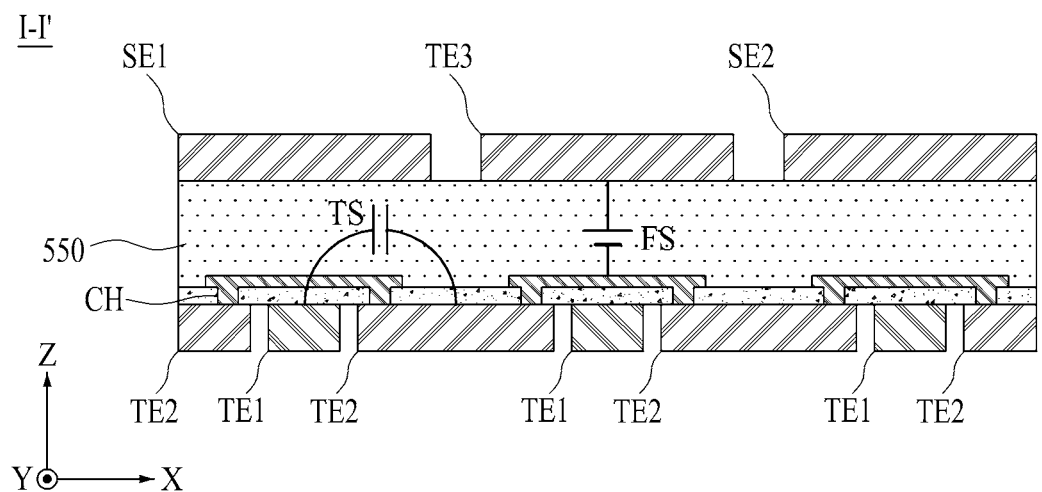
FIG. 3 is a cross-sectional view taken along line I-I' illustrated in FIG. 2.

FIG. 1 is a cross-sectional view for describing an organic light emitting display device according to an embodiment. FIG. 2 is a diagram for describing a configuration of a touch sensing layer illustrated in FIG. 1. FIG. 3 is a cross-sectional view taken along line I-I' illustrated in FIG. 2.

Referring to FIGS. 1 to 3, the organic light emitting display device according to an embodiment may include (i) a display layer 110A including a substrate 10, a pixel array layer 100, and an encapsulation layer 300, (ii) a touch sensing layer 500, (iii) a cover window 700, and (iv) a touch driving circuit 900.

The substrate 10, a base substrate, may include a plastic material or a glass material. The substrate 10 according to an embodiment may be formed of a flexible plastic material, for example, opaque or colored polyimide (PI). The substrate 10 according to an embodiment may be manufactured by curing polyimide resin which is coated on a top of a release layer provided on a relatively thick carrier substrate to have a certain thickness. Here, the carrier substrate may be separated from the substrate 10 by releasing the release layer through a laser release process.

Additionally, the organic light emitting display device according to an embodiment may further include a back plate which is coupled to a bottom of the substrate 10 with respect to a vertical axis direction Z (or a thickness direction of the substrate). The back plate may maintain the substrate 10 in a planar state. The back plate according to an embodiment may include a plastic material, for example, polyethyleneterephthalate (PET). The back plate may be laminated on the bottom of the substrate 10 separated from the carrier substrate, thereby maintaining the substrate 10 in a planar state.

The pixel array layer 100 may include a plurality of pixels SP that are provided on the substrate 10 to display an image.

The plurality of pixels SP may be respectively provided in a plurality of pixel areas defined by a plurality of gate lines, a plurality of data lines, and a plurality of pixel driving power lines. Each of the plurality of pixels SP may be an area corresponding to a minimum unit that actually emits light, and may be defined as a subpixel. At least three adjacent pixels SP may configure one unit pixel for displaying colors. For example, the one unit pixel may include a red pixel, a green pixel, and a blue pixel which are adjacent to each other, and may further include a white pixel so as to enhance luminance.

The plurality of pixels SP according to an embodiment may each include a pixel circuit PC, a planarization layer PL, an anode electrode AE, a bank layer BL, an organic light emitting device ED, and a cathode electrode CE.

The pixel circuit PC may be provided in a circuit area which is defined in a corresponding pixel SP, and may be connected to a gate line, a data line, and a pixel driving power line which are adjacent thereto. The pixel circuit PC may control a current flowing in the organic light emitting device ED according to a data signal supplied through the data line in response to a scan pulse supplied through the gate line, based on a pixel driving power supplied through the pixel driving power line. The pixel circuit PC according to an embodiment may include a switching thin film transistor (TFT), a driving TFT, and a capacitor.

The TFTs may each include a gate electrode, a gate insulation layer, a semiconductor layer, a source electrode, and a drain electrode. Here, each of the TFTs may be amorphous silicon (a-Si) TFT, a poly-Si TFT, an oxide TFT, an organic TFT, or the like.

The switching TFT may include a gate electrode connected to the gate line, a first electrode connected to the data line, and a second electrode connected to a gate electrode of the driving TFT. Here, each of the first and second electrodes of the switching TFT may be a source electrode or a drain electrode depending on a direction of a current. The switching TFT may be turned on according to the scan pulse supplied through the gate line to supply the data signal supplied through the data line to the driving TFT.

The driving TFT may be turned on by a voltage supplied through the switching TFT and/or a voltage of the capacitor to control an amount of current which flows from the pixel driving power line to the organic light emitting device ED. To this end, the driving TFT according to an embodiment may include a gate electrode connected to the second electrode of the switching TFT, a drain electrode connected to the pixel driving power line, and a source electrode connected to the organic light emitting device ED. The driving TFT may control a data current flowing from the pixel driving power line to the organic light emitting device ED, based on the data signal supplied through the switch TFT, and thus, the organic light emitting device ED may emit light having brightness proportional to the data signal.

The capacitor may be provided in an overlapping area between the gate electrode and the source electrode of the driving TFT. The capacitor may store a voltage corresponding to the data signal supplied to the gate electrode of the driving TFT and may turn on the driving TFT with the stored voltage.

In addition, the organic light emitting display device according to an embodiment may further include a scan driving circuit which is provided in a non-display area. The scan driving circuit may generate a scan pulse according to a gate control signal input thereto and may supply the scan pulse to the gate line. The scan driving circuit according to an embodiment may be provided in an arbitrary non-display area, where enables the scan pulse to be supplied to the gate line, of the non-display area provided on the substrate 10 along with the TFTs of the pixel SP.

The planarization layer PL may be provided on the substrate 10 to cover the pixel circuit PC and may provide a planarization surface on the substrate 10 where the TFTs are provided.

The anode electrode AE may be provided in a pattern type on the planarization layer PL which overlaps an opening area defined in each of the pixel areas. The anode electrode AE may be connected to the source electrode of the driving TFT, provided in the pixel circuit PC, through a contact hole provided in the planarization layer PL. The anode electrode AE may be formed of a metal material which is high in reflectivity, and for example, may include a material such as gold (Au), silver (Ag), aluminum (Al), molybdenum (Mo), magnesium (Mg), and/or the like, or may include an alloy thereof. However, the present embodiment is not limited thereto.

The bank layer BL may be provided on the planarization layer PL to cover an edge of the anode electrode AE and the pixel circuit PC to define the opening area of each pixel area. The bank layer BL according to an embodiment may include an organic material such as benzocyclobutene (BCB), acryl, polyimide, and/or the like. In addition, the bank layer BL may be formed of a photosensitive material containing a black pigment. In this case, the bank layer BL may act as a light blocking member (or a black matrix).

The organic light emitting device ED may be provided on the anode electrode AE in the opening area defined by the bank layer BL. The organic light emitting device ED may be provided in a structure where a hole injection layer, a hole transport layer, an organic emission layer, an electron transport layer, and an electron injection layer are sequentially stacked. Here, one or more of the hole injection layer, the hole transport layer, the electron transport layer, and the electron injection layer may be omitted. The organic emission layer according to an embodiment may be provided to emit lights of different colors (for example, red, green, and blue) in each pixel. According to another embodiment, the organic emission layer may be formed to emit lights of the same color (for example, white) in each pixel, and in this case, the organic light emitting device ED may include at least two organic emission layers.

The cathode electrode CE may be provided to cover the organic light emitting device ED and the bank layer BL and may be connected to the organic light emitting device ED in each pixel area in common. The cathode electrode CE may be formed of a transparent metal material which is high in light transmittance. The cathode electrode CE according to an embodiment may include a transparent conductive material (for example, indium tin oxide (ITO), indium zinc oxide (IZO), indium zinc tin oxide (IZTO), indium cesium oxide (ICO), indium tungsten oxide (IWO), etc.) such as transparent conductive oxide (TCO) and/or the like. Optionally, in the present embodiment, the cathode electrode CE may be formed of an amorphous transparent conductive material, for minimizing damage of the organic light emitting device ED which is caused by a process temperature when forming the cathode electrode CE.

The encapsulation layer 300 may be formed to cover the pixel array layer 100, for protecting the organic light emitting device ED vulnerable to external water or oxygen by preventing the water from penetrating into each pixel SP. That is, the encapsulation layer 300 may be provided on the substrate 10 to cover the cathode electrode CE. The encapsulation layer 300 according to an embodiment may be formed of an inorganic material layer or an organic material layer, or may be formed in a multi-layer structure where an inorganic material layer and an organic material layer are alternately stacked.

The encapsulation layer 300 according to an embodiment may include a first inorganic material layer 310 which is provided to cover the cathode electrode CE, an organic material layer 330 covering the first inorganic material layer 310, and a second inorganic material layer 350 covering the organic material layer 330.

The first inorganic material layer 310 may be disposed adjacent to the organic light emitting device ED and may be formed of an inorganic insulating material, which is capable of being deposited at a low temperature, such as nitride silicon (SiNx), oxide silicon (SiOx), oxynitride silicon (SiON), oxide aluminum ($Al_2O_3$), or the like. In this case, since the organic emission layer is vulnerable to a high temperature, the first inorganic material layer 310 may be formed by a low temperature process in a low temperature atmosphere, for example, 100 C.° or less. Accordingly, in the present embodiment, the organic light emitting device ED is prevented from being damaged by a high temperature atmosphere applied to a process chamber when forming the first inorganic material layer 310.

The organic material layer 330 may be provided on the substrate 10 to cover a whole top of the first inorganic material layer 310. The organic material layer 330 may relax a stress between layers caused by bending of the organic light emitting display device. The organic material layer 330 according to an embodiment may include an organic material such as BCB, acryl, polyimide, silicon oxycarbon (SiOC), and/or the like.

The second inorganic material layer 350 may be provided on the substrate 10 to cover a whole top of the organic material layer 330 and cover each of side surfaces of the first inorganic material layer 310. The second inorganic material layer 350 primarily prevents water or oxygen from penetrating into the organic material layer 330 and the first inorganic material layer 310 from the outside of the organic light emitting display device. The second inorganic material layer 350 according to an embodiment may be formed of an inorganic insulating material, which is capable of being deposited at a low temperature, such as SiNx, SiOx, SiON, $Al_2O_3$, or the like.

The substrate 10, the pixel array layer 100, and the encapsulation layer 300 may configure an organic light emitting display panel.

The touch sensing layer 500 may sense a position and a touch force of a user touch on the cover window 700, and may be directly provided on the encapsulation layer 300 of the organic light emitting display panel. That is, the touch sensing layer 500 may not be separately manufactured or may not be indirectly coupled to a top of the encapsulation layer 300 by a separate optical adhesive, and may be directly formed on the top of the encapsulation layer 300 so as to reduce a thickness of the organic light emitting display device.

The touch sensing layer 500 according to an embodiment may include a first touch electrode layer 510 provided on the encapsulation layer 300, a second touch electrode layer 530 provided on the first touch electrode layer 510, and a pressure reaction member 550 disposed between the first touch electrode layer 510 and the second touch electrode layer 530.

The first touch electrode layer 510 may include a plurality of first touch electrodes TE1 and a plurality of second touch electrodes TE2, which are directly coupled to the top of the encapsulation layer 300.

The plurality of first touch electrodes TE1 may be directly formed on the top of the encapsulation layer 300 and may each act as a first touch driving electrode for sensing a touch position based on a user touch. The plurality of first touch electrodes TE1 may be spaced apart from each other by a certain interval along a first horizontal axis direction X of the substrate 10 and may be directly formed on the top of the encapsulation layer 300 in parallel with a second horizontal axis direction Y of the substrate 10.

Each of the plurality of first touch electrodes TE1 according to an embodiment may include a plurality of first touch electrode patterns TE1a, which are arranged at certain intervals along the second horizontal axis direction Y of the substrate 10, and a plurality of connection patterns TE1b which electrically connect the first touch electrode patterns TE1a adjacent to each other in the second horizontal axis direction Y.

The plurality of first touch electrode patterns TE1a and the plurality of connection patterns TE1b may be directly formed on the top of the encapsulation layer 300. Each of the plurality of first touch electrode patterns TE1a may have a rectangular shape, an octagonal shape, a circular shape, a lozenged shape, or the like, and each of the plurality of connection patterns TE1b may have a bar shape.

Each of the plurality of first touch electrodes TE1 may be connected to the touch driving circuit 900 through a corresponding first routing line among a plurality of first routing lines RL1 provided on the substrate 10. The plurality of first touch electrodes TE1 may receive a first touch driving pulse supplied from the touch driving circuit 900 during a first touch sensing period (or a touch position sensing period). During a second touch sensing period (or a touch force sensing period), the plurality of first touch electrodes TE1 may be electrically floated by the touch driving circuit 900. Here, the plurality of first routing lines RL1 may be connected to the touch driving circuit 900 through a first flexible printed circuit film.

The plurality of second touch electrodes TE2 may be directly formed on the top of the encapsulation layer 300 and may each act as a touch sensing electrode for sensing a touch based on a user touch. The plurality of second touch electrodes TE2 may be directly formed on the top of the encapsulation layer 300 in parallel with the first horizontal axis direction X of the substrate 10 and may be arranged at certain intervals along the second horizontal axis direction Y of the substrate 10.

Each of the plurality of second touch electrodes TE2 according to an embodiment may include a plurality of second touch electrode patterns TE2a, which are arranged at certain intervals along the first horizontal axis direction X of the substrate 10, and a plurality of bridge patterns TE2b which electrically connect the second touch electrode patterns TE2a adjacent to each other in the first horizontal axis direction X.

The plurality of second touch electrode patterns TE2a may be directly formed on the top of the encapsulation layer 300 corresponding to a portion between the first touch electrode patterns TE1a adjacent to each other in the second horizontal axis direction Y. Each of the plurality of second touch electrode patterns TE2a may have a shape which is the same as that of the first touch electrode patterns TE1a.

The plurality of bridge patterns TE2b may be provided on a layer different from the second touch electrode patterns TE2a and may electrically connect two second touch electrode patterns TE2a which are adjacent to each other and are separated from each other by the connection pattern TE1b of the first touch electrode TE1. In this case, each of the plurality of bridge patterns TE2b and the connection pattern TE1b of the first touch electrode TE1 may be electrically disconnected from each other by a touch insulation layer 511.

The touch insulation layer 511 may be provided on the encapsulation layer 300 to cover the plurality of first touch electrodes TE1 and the plurality of second touch electrode patterns TE2a and may have a thickness of 500 Å to 5 µm. The touch insulation layer 511 may be formed of an organic material or an inorganic material. If the touch insulation layer 511 is formed of the organic material, the touch insulation layer 511 may be provided by a coating process of coating the organic material on the encapsulation layer 300 and a curing process of curing the coated organic material at a temperature of 100 C.° or less. If the touch insulation layer 511 is formed of the inorganic material, the touch insulation layer 511 may be provided by the inorganic material deposited on the encapsulation layer 300 through a low temperature chemical deposition process and a cleaning process which are alternately performed twice or more.

Both edges of each of the plurality of bridge patterns TE2a may be connected to the second touch electrode patterns TE2a adjacent to the connection pattern TE1b of the first touch electrode TE1 through a contact hole CH provided in the touch insulation layer 511 to overlap an edge of the adjacent second touch electrode patterns TE2a. Therefore, a plurality of second touch electrode patterns TE2a which are spaced apart from each other with the connection pattern TE1b of the first touch electrode TE1 therebetween may be electrically connected to each other by a plurality of bridge patterns TE2b to configure one second touch electrode TE2. The plurality of bridge patterns TE2b according to an embodiment may be formed of a transparent conductive material (for example, ITO, IZO, IZTO, ICO, IWO, etc.) such as TCO and/or the like, or may be formed of a metal material, which is strong in corrosion resistance and acid resistance, such as Al, titanium (Ti), copper (Cu), Mo, and/or the like. The plurality of bridge patterns TE2b may be provided by a physical deposition process such as room temperature sputtering or a chemical deposition process such as low temperature chemical vapor deposition and a patterning process which includes a photolithography process and an etching process.

Each of the plurality of second touch electrodes TE2 may be connected to the touch driving circuit 900 through a corresponding second routing line among a plurality of second routing lines RL2 provided on the substrate 10. The plurality of second touch electrodes TE2 may be used as a common touch sensing electrode for sensing a touch position and a touch force based on a user touch. Here, the plurality of second routing lines RL2 may be connected to the touch driving circuit 900 through the first flexible printed circuit film.

The plurality of first touch electrodes TE1 and the plurality of second touch electrodes TE2 according to the present embodiment may be formed of an amorphous transparent conductive material, for example, amorphous ITO. For example, the plurality of first and second touch electrodes TE1 and TE2 may be formed of an amorphous transparent conductive material by a low temperature deposition process having a process temperature of 100 C.° or less, for preventing or minimizing damage of the pixel array layer 100 which is caused by a process temperature for forming the first and second touch electrodes TE1 and TE2. That is, if the first and second touch electrodes TE1 and TE2 are formed of a crystalline transparent conductive material, there is a problem where the pixel array layer 100 is damaged by a high temperature thermal treatment process performed for securing a low resistance value. In order to solve the problem, in the present embodiment, the first touch electrodes TE1 and the second touch electrodes TE2 may be formed of the amorphous transparent conductive material through a low temperature metal deposition process.

The pressure reaction member 550 may be provided on the encapsulation layer 300 to cover the first touch electrode layer 510. That is, the pressure reaction member 550 may be directly provided on the encapsulation layer 300 where the first touch electrode layer 510 is provided, and may cover the first touch electrode layer 510. The pressure reaction member 550 according to an embodiment may have electrical characteristic which is changed based on a touch force (or a touch pressure) of a user, and thus, may act as a pressure reaction sensor for sensing the touch force of the user.

The pressure reaction member 550 according to an embodiment may include a piezoelectric material having a piezoelectric effect. Here, the piezoelectric effect may denote a phenomenon in which a crystal structure is deformed or twisted by a force applied thereto, thus relative positions of a positive (+) ion and a negative ion (−) are changed, and a potential difference occurs, for example, between the first touch electrode layer 510 and the second touch electrode layer 530 due to dielectric polarization. In an embodiment in which the pressure reaction member 550 includes piezoelectric materials, the electrical characteristic of the pressure reaction member 550 is a capacitance of the pressure reaction member 550 between the first touch electrode layer 510 and the second touch electrode layer 530 induced due to the potential difference. By measuring a change in the capacitance of the pressure reaction member 550, an amount of force of a touch on the cover window 700 can be determined.

The piezoelectric material according to an embodiment may include one of polyvinylidene difluoride (PVDF), lead zirconate titanate (PZT), $BaTiO_3$, and parylene-C, but may include a material having the piezoelectric effect without being limited thereto. For example, the PVDF is a semicrystalline ferroelectric polymer, having a high elastic coefficient and good flexibility. Here, the PVDF may have an elastic coefficient between 300 and 2000 MPa. The flexibility of PVDF may increase as the elastic coefficient is reduced.

The PVDF is easy to manufacture as a film, and is light and flexible. In addition PVDF can withstand a large impact. Therefore, the pressure reaction member 550 according to an embodiment may include the PVDF.

According to another embodiment, the pressure reaction member 550 may include a piezoresistive material having a piezoresistive effect. Here, the piezoresistive effect may denote a phenomenon in which conduction energy is generated by applied pressure or force, thus an electric charge moves to a conduction band, and an electrical resistance (or resistivity) of a material varies. The piezoresistive effect causes a variation of an electrical resistance, and thus, is differentiated from the piezoelectric effect that causes a variation of an electrical potential. In an embodiment in which the pressure reaction member 550 includes piezoresistive materials, the electrical characteristic of the pressure reaction member 550 is a resistance of the pressure reaction member 550 between the first touch electrode layer 510 and the second touch electrode layer 530. By measuring a change in the resistance, an amount of force of a touch on the cover window 700 can be determined.

A material having the piezoresistive effect may be metal, semiconductor, a conductive polymer, a conductive composite, or the like. Rubber has lower Young's modulus than other materials, and thus, if the rubber is used as a substrate of a composite, the composite can achieve high flexibility. Accordingly, the rubber may be sufficiently used as a material for sensing a touch force and may have elasticity which is restored to the original shape without being largely deformed despite repeated deformation. Also, silicone rubber in the conductive composite is good in heat resistance, cold resistance, weather resistance, and water resistance. If the silicone rubber includes a conductive filler, the silicone rubber can have the piezoresistive effect. Here, silicone rubber may have an elastic coefficient between 1 and 10 MPa.

The piezoresistive material according to an embodiment may include a polymer and a conductive filler. The polymer according to an embodiment may include rubber or silicon rubber. The conductive filler according to an embodiment may include one of metal, semiconductor metal oxide, and a carbon-based material. For example, the metal may be nickel (Ni), copper (Cu), silver (Ag), aluminum (Al), iron (Fe), or the like. The semiconductor metal oxide may be vanadium oxide ($V_2O_3$), titanium oxide (TiO), or the like. The carbon-based material may be carbon black, graphite, graphene, carbon nano tube (CNT), or the like.

Figure 4:
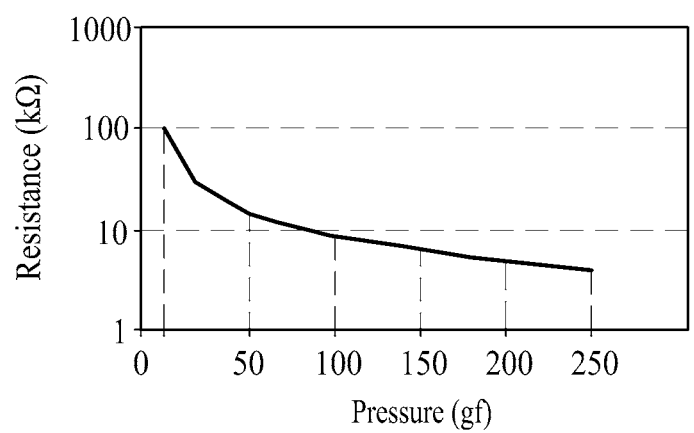
FIG. 4 is a graph for describing a resistance variation caused by pressure applied to a pressure reaction member illustrated in FIG. 2.

According to an experiment, as shown in FIG. 4, it can be seen that as applied pressure increases, a resistance value of the piezoresistive material is progressively lowered.

The second touch electrode layer 530 may be directly provided on a top of the pressure reaction member 550. That is, the second touch electrode layer 530 may include a plurality of third touch electrodes TE3 which are directly provided on the top of the pressure reaction member 550 to intersect the plurality of second touch electrodes TE2.

The plurality of third touch electrodes TE3 may directly contact the pressure reaction member 550 and may each act as a second touch driving electrode for sensing a touch force based on a user touch. The plurality of third touch electrodes TE3 may be directly formed on the top of the pressure reaction member 550 and may be arranged at certain intervals along the first horizontal axis direction X of the substrate 10 in parallel with the second horizontal axis direction Y of the substrate 10. The plurality of third touch electrodes TE3 according to an embodiment may each be patterned in a bar shape, an octagonal shape, a circular shape, or a lozenged shape to respectively overlap the plurality of second touch electrodes TE2, but are not limited thereto. In other embodiments, the plurality of third touch electrodes TE3 may each be patterned in a shape which is the same as that of each of the plurality of second touch electrodes TE2. In this case, each of the plurality of third touch electrodes TE3 may include a plurality of third touch electrode patterns overlapping the plurality of second touch electrodes TE2 and a plurality of connection patterns which electrically connect the third touch electrode patterns adjacent to each other in the second horizontal axis direction Y.

Each of the plurality of third touch electrodes TE3 may be connected to the touch driving circuit 900 through a corresponding third routing line among a plurality of third routing lines RL3 provided on the substrate 10. The plurality of third touch electrodes TE3 may be electrically floated by the touch driving circuit 900 during the first touch sensing period. During the second touch sensing period, the plurality of third touch electrodes TE3 may receive a second touch driving pulse supplied from the touch driving circuit 900. Here, the plurality of third routing lines RL3 may be connected to the touch driving circuit 900 through a second flexible printed circuit film.

Since the plurality of third touch electrodes TE3 according to the present embodiment is directly provided on the top of the pressure reaction member 550, the plurality of third touch electrodes TE3 may be formed of an amorphous transparent conductive material (for example, amorphous ITO), based on the same reason as that of the plurality of first touch electrodes TE1 and the plurality of second touch electrodes TE2.

The second touch electrode layer 530 according to the present embodiment may include a plurality of secondary electrodes SE1 and SE2 which are provided along with the plurality of third touch electrodes TE3 and are disposed adjacent to at least one of one side TE3a and the other side TE3b of each of the plurality of third touch electrodes TE3. That is, the second touch electrode layer 530 according to an embodiment may include a plurality of first secondary electrodes SE1, which are provided adjacent to and in parallel with the one side TE3a of each of the third touch electrodes TE3, and a plurality of second secondary electrodes SE2 which are provided adjacent to and in parallel with the other side TE3b of each of the third touch electrodes TE3. Each of the plurality of first and second secondary electrodes SE1 and SE2 may have a shape which is the same as that of each of the third touch electrodes TE3.

Each of the plurality of first secondary electrodes SE1 may be connected to the touch driving circuit 900 through a corresponding first secondary routing line among a plurality of first secondary routing lines SRL1, and each of the plurality of second secondary electrodes SE2 may be connected to the touch driving circuit 900 through a corresponding second secondary routing line among a plurality of second secondary routing lines SRL2. Each of the plurality of first and second secondary electrodes SE1 and SE2 may be floated by the touch driving circuit 900 or may be electrically connected to the third routing line RL3 adjacent thereto. In more detail, the plurality of first secondary electrodes SE1 and the plurality of second secondary electrodes SE2 may be electrically floated during the first touch sensing period. On the other hand, during the second touch sensing period, the plurality of first secondary electrodes SE1 and the plurality of second secondary electrodes SE2 may be electrically connected to the third touch electrode TE3 adjacent thereto and may receive the second touch driving pulse supplied from the touch driving circuit 900, and thus, an overlapping area between the second touch electrodes TE2 and the third touch electrodes TE3 increases, thereby enhancing an efficiency of touch force sensing. Here, the plurality of first secondary routing lines SRL1 and the plurality of second secondary routing lines SRL2 may be connected to the touch driving circuit 900 through the second flexible printed circuit film.

The plurality of first secondary electrodes SE1 and the plurality of second secondary electrodes SE2 may be used as a touch force sensing electrode for sensing a touch force and may be used as a floating electrode which enables a touch position to be sensed.

In addition, in FIG. 2, each of the plurality of first secondary electrodes SE1 and the plurality of second secondary electrodes SE2 is illustrated as having a bar shape, but is not limited thereto. In other embodiments, in order to increase a transmittance of light emitted from each pixel SP, each of the plurality of first secondary electrodes SE1 and the plurality of second secondary electrodes SE2 may be formed in a plurality of line structures, mesh structures, or trapezoid structures which are electrically connected to each other, or may include a plurality of openings which are arranged at certain intervals in a slit or lattice type.

The pressure reaction member 550 may be disposed between the first touch electrode layer 510 and the second touch electrode layer 530 and on the plurality of first touch electrodes TE1 and the plurality of second touch electrodes TE2. Accordingly, a touch sensor TS may be provided between adjacent first and second touch electrodes TE1 and TE2, and a force sensor FS may be provided between adjacent second and third touch electrodes TE2 and TE3.

The touch sensor TS according to an embodiment may be defined as a mutual capacitance which is provided in the pressure reaction member 550 between adjacent first and second touch electrodes TE1 and TE2.

The force sensor FS according to an embodiment may be a piezoelectric sensor or a piezoresistive sensor between adjacent second and third touch electrodes TE2 and TE3. Here, for example, if the pressure reaction member 550 includes the piezoelectric material, the force sensor FS may act as the piezoelectric sensor. As another example, if the pressure reaction member 550 includes the piezoresistive material, the force sensor FS may act as the piezoresistive sensor.

An electric charge may be charged into the mutual capacitance of the touch sensor TS according to the first touch driving pulse applied to the first touch electrode TE1, and the charged electric charge may vary according to whether a user touch is made. Therefore, a touch position may be sensed by using a touch position calculation algorithm which models a reduction in the mutual capacitance provided in the touch sensor TS, based on a user touch.

A voltage of the force sensor FS according to an embodiment may vary according to the piezoelectric effect based on an elasticity change of the pressure reaction member 550 caused by a touch force of a user. In this case, as pressure based on the touch force of the user becomes higher, the voltage of the force sensor FS may increase, and thus, a touch force level may be sensed by using a touch force level calculation algorithm which models a voltage increase rate of the force sensor FS, based on the touch force of the user.

According to another embodiment, a resistance of the force sensor FS may vary according to the piezoresistive effect based on an elasticity change of the pressure reaction member 550 caused by a touch force of a user. In this case, as pressure based on the touch force of the user becomes higher, the resistance of the force sensor FS may be reduced, and thus, a touch force level may be sensed by using a touch force level calculation algorithm which models a voltage variation rate with respect to a resistance reduction rate of the force sensor FS, based on the touch force of the user. That is, in the present embodiment, a resistance variation of the force sensor FS may be calculated by sensing a voltage variation of the force sensor FS caused by the touch force of the user, and a touch force level corresponding to the varied resistance value may be calculated by using a lookup table.

Referring again to FIGS. 1 to 3, the cover window 700 may be coupled to a top of the touch sensing layer 500. That is, the cover window 700 may be coupled to the top of the pressure reaction member 550, where the plurality of third touch electrodes TE3 are provided, through an optical adhesive member 600. Here, the optical adhesive member 600 may include an optical clear adhesive (OCA), an optical clear resin (OCR), or the like. The cover window 700 may cover the touch sensing layer 500 to protect the pixel array layer 100 as well as the touch sensing layer 500 and may act as a touch surface for a user touch.

The cover window 700 according to an embodiment may be formed of tempered glass, transparent plastic, a transparent film, or the like. For example, the cover window 700 may include at least one of sapphire glass and gorilla glass. As another example, the cover window 700 may include at least one of polyethyleneterephthalate (PET), polycarbonate (PC), polyethersulfone (PES), polyethylenapthanate (PEN), polyimide (PI), and polynorborneen (PNB). The cover window 700 may include tempered glass, based on scratch and transparency.

The touch driving circuit 900 may be connected to the plurality of first touch electrodes TE1, the plurality of second touch electrodes TE2, and the plurality of third touch electrodes TE3. That is, the touch driving circuit 900 may be connected to the plurality of first touch electrodes TE1, the plurality of second touch electrodes TE2, and the plurality of third touch electrodes TE3 through the plurality of first to third routing lines RL1, RL2 and RL3 provided on the substrate 10 in a one-to-one relationship and may be connected to the plurality of first and second secondary electrodes SE1 and SE2 through the plurality of first and second secondary routing lines SRL1 and SRL2 provided on the substrate 10 in a one-to-one relationship.

The touch driving circuit 900 according to an embodiment may time-divisionally drive the touch sensing layer 500 in the first touch sensing period and the second touch sensing period in response to a touch mode signal supplied from a host control circuit, and in each of the first touch sensing period and the second touch sensing period, when a touch event occurs, the touch driving circuit 900 may drive the touch sensing layer 500 in a haptic mode. Here, the first touch sensing period may be defined as a touch position sensing period for sensing a touch event and a touch position by a user, the second touch sensing period may be defined as a touch force sensing period for sensing a touch force, and the haptic mode may be defined as a haptic feedback period where a haptic effect is provided in response to a touch event. In this case, in the second touch sensing period, a touch force may be sensed in a touch event area of the first touch sensing period, for shortening a touch force sensing time. That is, the touch driving circuit 900 may primarily perform touch position sensing through global touch sensing or group touch sensing to detect a touch event area, and may secondarily perform touch force sensing on only the touch event area through local force touch sensing.

Figure 5A:
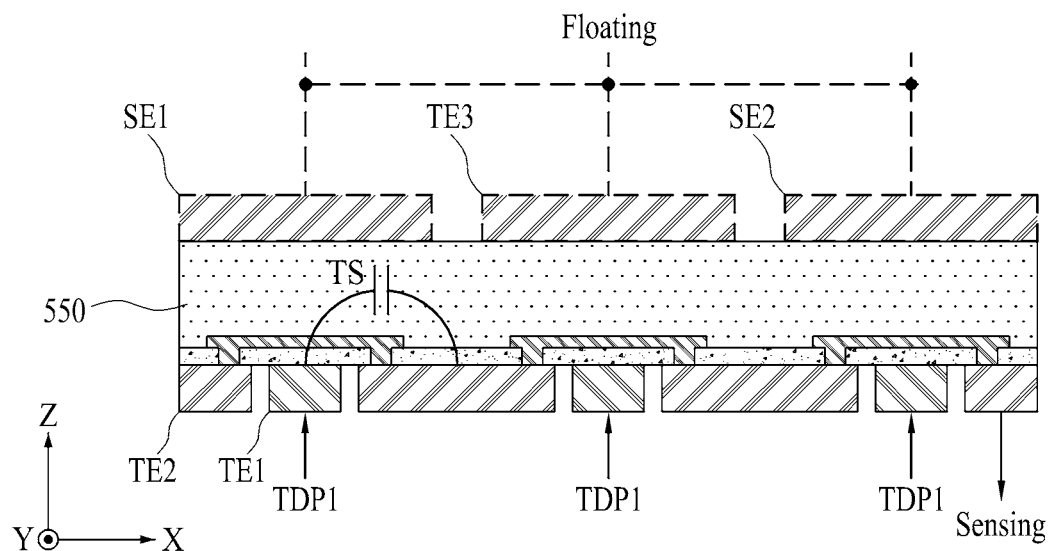
FIGS. 5A and 5B are cross-sectional views for describing a driving method of an organic light emitting display device according to an embodiment.

During the first touch sensing period, as illustrated in FIG. 5A, the touch driving circuit 900 may electrically float the plurality of third touch electrodes TE3 and the plurality of first and second secondary electrodes SE1 and SE2, apply a first touch driving pulse TDP1 to at least one of the plurality of first touch electrodes TE1, and sense a mutual capacitance variation of the touch sensor TS, caused by a user touch, through the plurality of second touch electrodes TE2 to generate a first touch sensing signal. For example, during the first touch sensing period, the touch driving circuit 900 may sequentially apply the first touch driving pulse TDP1 to the plurality of first touch electrodes TE1 and may sense the mutual capacitance variation of the touch sensor TS, provided between the first touch electrode TE1 to which the first touch driving pulse TDP1 is applied and the second touch electrode TE2 adjacent thereto, through the plurality of second touch electrodes TE2 to generate the first touch sensing signal.

During the second touch sensing period, the touch driving circuit 900 may electrically float the plurality of first touch electrodes TE1, apply a second touch driving pulse TDP2 to at least one of the plurality of third touch electrodes TE3, and sense a voltage variation of the force sensor FS, caused by a touch force of a user, through the plurality of second touch electrodes TE2 to generate a second touch sensing signal. For example, during the second touch sensing period, the touch driving circuit 900 may sequentially apply the second touch driving pulse TDP2 to the plurality of third touch electrodes TE3 and may sense a voltage variation (or a resistance variation) of the force sensor FS, provided between the third touch electrode TE3 to which the second touch driving pulse TDP2 is applied and the second touch electrode TE2 overlapping the third touch electrode TE3, through the plurality of second touch electrodes TE2 to generate the second touch sensing signal.

In addition, the touch driving circuit 900 may determine the presence of a touch event to calculate a touch event area, based on the first touch sensing signal generated through sensing during the first touch sensing period, apply the second touch driving pulse TDP2 to at least one third touch electrode TE3 provided in the touch event area during the second touch sensing period, and sense a voltage variation of the force sensor FS of the pressure reaction member 550, caused by a touch force of a user, through the plurality of second touch electrodes TE2 to generate the second touch sensing signal. Subsequently, based on the second touch sensing signal, the touch driving circuit 900 may calculate touch position coordinates to output the touch position coordinates to the host control circuit, or may calculate a touch force level and touch position coordinates to output the touch force level and the touch position coordinates to the host control circuit. That is, in the present embodiment, during the second touch sensing period, touch force sensing may be locally performed on a touch event area which is calculated through sensing in the first touch sensing period, thereby shortening a touch force sensing time for which a touch force of a user is sensed.

Figure 5B:
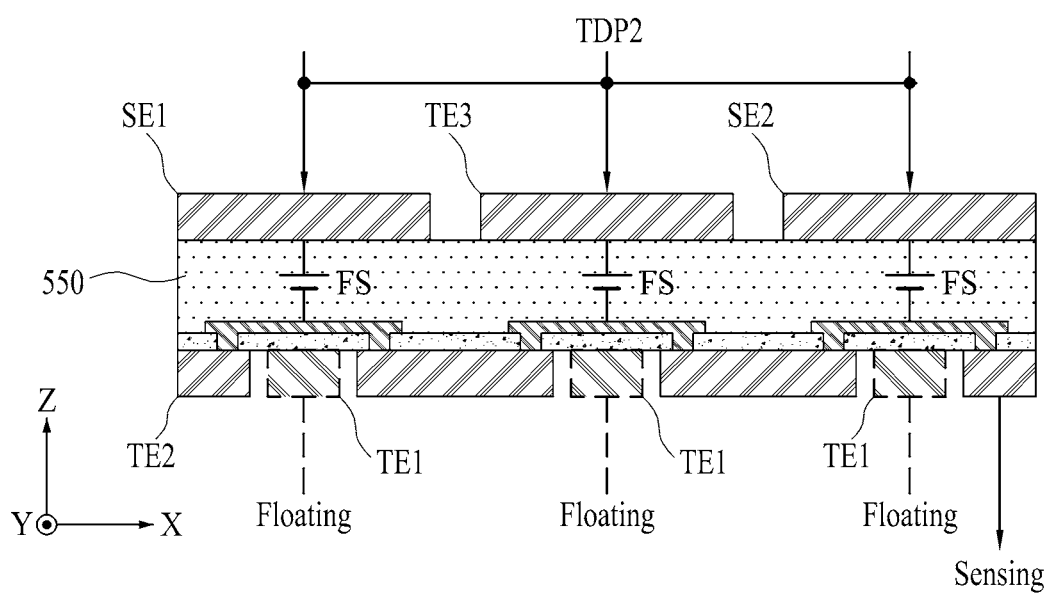

According to another embodiment, as illustrated in FIG. 5B, during the second touch sensing period, the touch driving circuit 900 may electrically float the plurality of first touch electrodes TE1, electrically connect each of the plurality of first and second secondary electrodes SE1 and SE2 to the third touch electrode TE3 adjacent thereto, apply the second touch driving pulse TDP2 to at least one of the plurality of third touch electrodes TE3, and sense a voltage variation (or a resistance variation) of the force sensor FS of the pressure reaction member 550, caused by a touch force of a user, through the plurality of second touch electrodes TE2 to generate the second touch sensing signal. In this case, each of the plurality of third touch electrodes TE3 respectively overlapping the plurality of second touch electrodes TE2 may be electrically connected to the first and second secondary electrodes SE1 and SE2 adjacent thereto, and thus, an overlapping area between the third touch electrode TE3 and the second touch electrode TE2 increases by an area of the first and second secondary electrodes SE1 and SE2. Therefore, the voltage (or the resistance) generated in the force sensor FS may further vary by an area of the first and second secondary electrodes SE1 and SE2 connected to the third touch electrode TE3, and thus, in present embodiment, the voltage variation (or the resistance variation) of the force sensor FS caused by the touch force of the user is more easily sensed.

In addition, since the pressure reaction member 550 is disposed between the first touch electrode layer 510 and the second touch electrode layer 530, the pressure reaction member 550 may act as a haptic output device. That is, the organic light emitting display device according to the present embodiment may realize the haptic mode by using the pressure reaction member 550. The haptic mode according to an embodiment may include a vibration haptic mode based on a vibration of the pressure reaction member 550 and an electrostatic haptic mode based on an electrostatic force of the pressure reaction member 550.

In the vibration haptic mode according to an embodiment, the touch driving circuit 900 may supply a first haptic driving signal to the plurality of first touch electrodes TE1 and may supply a second haptic driving signal to the plurality of third touch electrodes TE3. Here, the first haptic driving signal may be a first alternating current (AC) signal having a constant frequency, and the second haptic driving signal may be a direct current (DC) voltage having a constant voltage level. In the vibration haptic mode, the pressure reaction member 550 may be repeatedly expanded and contracted by a piezoelectric effect based on the first AC signal applied to the plurality of first touch electrodes TE1 and the DC voltage applied to the plurality of third touch electrodes TE3 to cause vibration, thereby providing a vibration haptic effect. An intensity of the vibration may vary according to a frequency and/or amplitude of the first AC signal. In this case, since the pressure reaction member 550 may act as an actuator that vibrates according to a haptic driving signal applied to each of the first touch electrodes TE1 and the third touch electrodes TE3.

In the electrostatic haptic mode according to an embodiment, the touch driving circuit 900 may supply the first haptic driving signal to the plurality of first touch electrodes TE1 and may supply a third haptic driving signal to the plurality of third touch electrodes TE3. Here, the first haptic driving signal may be the first AC signal having a constant frequency, and the third haptic driving signal may be a second AC signal having a frequency which is the same as or different from that of the first AC signal. In the electrostatic haptic mode, since the pressure reaction member 550 functions as an insulating layer, an electrostatic force occurs between the electrodes and a user's finger in accordance with the first AC signal and the second AC signal. Thus, the pressure reaction member 550 may provide an electrostatic haptic effect by the electrostatic force. An intensity of the electrostatic force may vary according to a frequency and/or amplitude of each of the first and second AC signals.

The vibration haptic effect based on the vibration haptic mode may be a mechanical vibration, and even when a relatively short touch occurs, the vibration haptic effect enables a user to recognize the relatively short touch. However, in the electrostatic haptic effect based on the electrostatic haptic mode, when the relatively short touch occurs, it is difficult for the user to recognize the relatively short touch. Therefore, the haptic mode may be set as the vibration haptic mode and the electrostatic haptic mode, based on a touch duration. If the touch duration is equal to or more than a reference value, the haptic mode according to an embodiment may be set as the electrostatic haptic mode, and if the touch duration is less than the reference value, the haptic mode may be set as the vibration haptic mode. For example, if a user touch is a temporary touch event corresponding to a click or a double click, the haptic mode may be set as the vibration haptic mode. Also, if the user touch is a continuous touch event corresponding to a touch and drag, the haptic mode may be set as the electrostatic haptic mode.

In addition, the touch driving circuit 900 may determine the presence of a touch event, based on the first touch sensing signal generated through sensing during the first touch sensing period and may perform the haptic mode corresponding to the touch event. For example, the touch driving circuit 900 may apply the haptic driving signal to the first and third touch electrodes TE1 and TE3 provided in a user touch area according to a touch event sensed during the first touch sensing period, thereby providing the user with a vibration feedback based on the vibration haptic effect or a tactile feedback based on the electrostatic haptic effect in the user touch area.

As described above, since the touch sensing layer 500 is directly provided in the organic light emitting display panel, the organic light emitting display device according to an embodiment has a thin thickness despite including the touch panel. The organic light emitting display device may sense a mutual capacitance variation caused by a user touch to sense a touch position by the user, and may sense a voltage or resistance variation of the pressure reaction member 550 caused by a touch force of the user to sense the touch force of the user. Also, in the organic light emitting display device according to an embodiment, the first and second secondary electrodes SE1 and SE2 may be connected to the third touch electrode TE3 when sensing the touch force of the user, and thus, an area of the third touch electrode TE3 overlapping the second touch electrode TE2 increases, thereby increasing an efficiency of touch force sensing.

Figure 6:
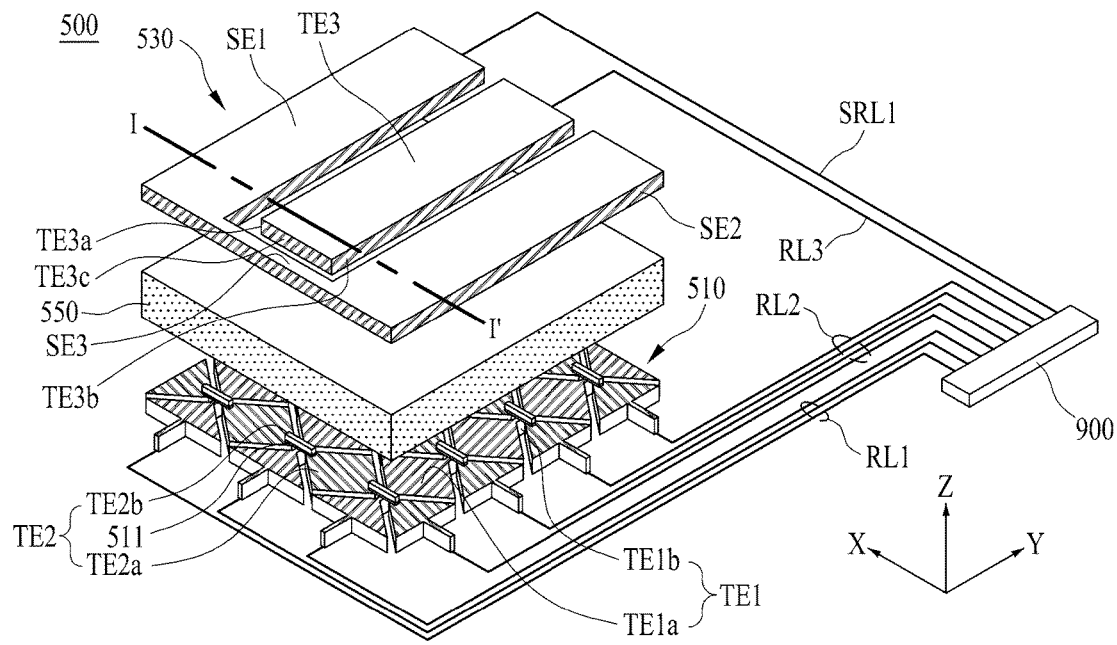
FIG. 6 is a diagram illustrating a modification example of a touch sensing layer in an organic light emitting display device according to an embodiment.

FIG. 6 is a diagram illustrating a modification example of a touch sensing layer in an organic light emitting display device according to an embodiment and is configured by electrically connecting the first and second secondary electrodes illustrated in FIG. 2. Therefore, only first and second secondary electrodes and elements relevant thereto will be described.

One side of each of the first and second secondary electrodes SE1 and SE2 may be electrically connected to each other by a connection secondary electrode SE3.

The connection secondary electrode SE3 may be spaced apart from one end (for example, one short side TE3c) of the third touch electrode TE3 and may be provided in parallel with the one short side TE3c, and moreover, the connection secondary electrode SE3 may electrically connect one ends of the first and second secondary electrodes SE1 and SE2 which are parallel to each other with an adjacent third touch electrode TE3 therebetween. Therefore, the connection secondary electrode SE3 may connect one ends of the first and second secondary electrodes SE1 and SE2 which are adjacent to one side TE3a and the other side TE3b of the third touch electrode TE3. That is, each of the plurality of first second electrodes SE1 may be provided adjacent to one side of a corresponding third touch electrode TE3. The connection secondary electrode SE3 may be provided in plurality. Each of the plurality of connection secondary electrodes SE3 may be spaced apart from the one short side TE3c of the third touch electrode TE3 adjacent thereto, may be parallel to the one short side TE3c, and may extend from one end of a corresponding first secondary electrode SE1. Also, each of the plurality of second secondary electrodes SE2 may be adjacent to the other side of a corresponding third touch electrode TE3 and may extend from an end of a corresponding connection secondary electrode SE3. Therefore, a plurality of secondary electrodes which include the plurality of first secondary electrodes SE1, the plurality of connection secondary electrodes SE3, and the plurality of second secondary electrodes SE2 may be electrically connected to each other, may be provided on the same layer, and may have a ⊂-shape or a ⊃-shape, thereby surrounding sides of the third touch electrode TE3 other than the other short side of the third touch electrode TE3. Here, the other short side of the third touch electrode TE3 may be defined as a portion connected to the secondary routing line SRL.

Since the one ends of the first and second secondary electrodes SE1 and SE2 are connected to each other by the connection secondary electrode SE3, ones of the plurality of first and second secondary routing lines SRL1 and SRL2 may be omitted. In this case, according to the present embodiment, a width of an edge of the substrate 10 where a routing line is provided is reduced, and thus, a bezel width of the organic light emitting display device is reduced.

Figure 7:
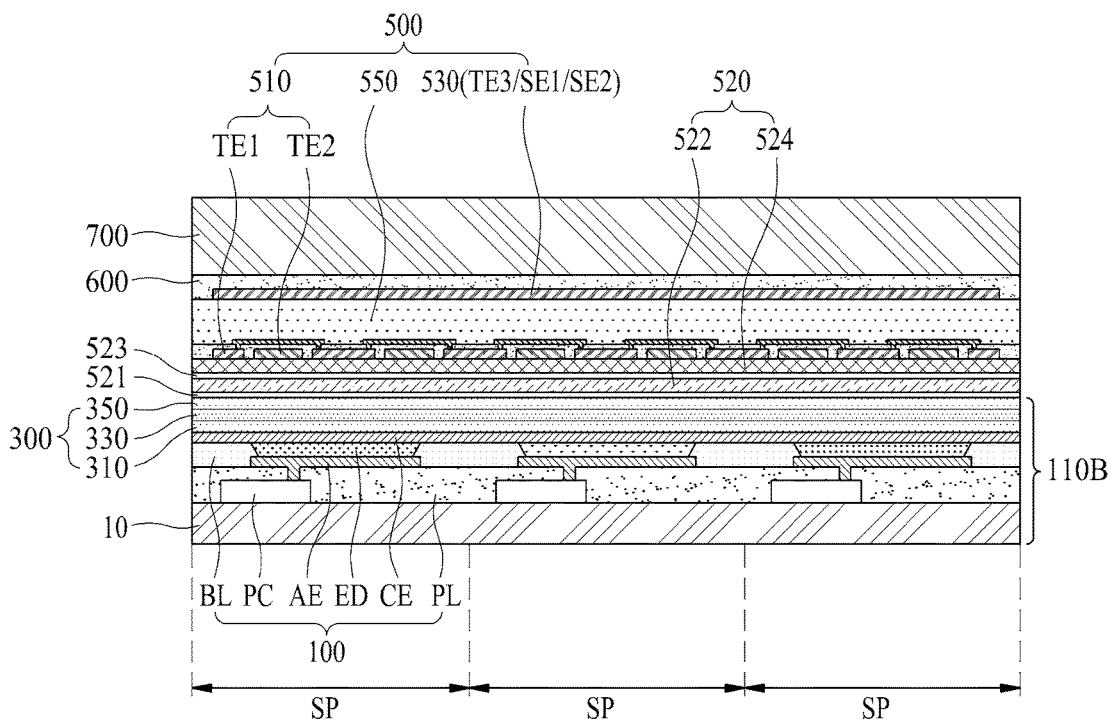
FIG. 7 is a cross-sectional view for describing an organic light emitting display device according to another embodiment.

FIG. 7 is a cross-sectional view for describing an organic light emitting display device according to another embodiment and is configured by adding a function layer to the organic light emitting display device illustrated in FIGS. 1 to 5B. Therefore, only a function layer and elements relevant thereto will be described.

Referring to FIG. 7, in the organic light emitting display device according to the present embodiment, the display layer 110B additionally includes a function layer 520 on the encapsulation layer 300. The function layer 520 may be disposed between an encapsulation layer 300 and a first touch electrode layer 510. The function layer 520 additionally prevents an organic light emitting device ED from being damaged by external water or oxygen. Also, the function layer 520 enhances the luminance characteristic of light emitted from each of a plurality of pixels SP.

The function layer 520 according to one or more embodiments may include a barrier film 522 disposed between the encapsulation layer 300 and the first touch electrode layer 510.

The barrier film 522 according to an embodiment may be adhered to a whole top of the encapsulation layer 300 by a first transparent adhesive 521 to cover the whole top of the encapsulation layer 300. In this case, with respect to a vertical axis direction Z (or a thickness direction of the barrier film 522), a bottom of the barrier film 522 may be coupled to the encapsulation layer 300 by the first transparent adhesive 521, and a top of the barrier film 522 may be directly coupled to a bottom of the first touch electrode layer 510.

According to one or more embodiments, the function layer 520 may include the barrier film 522, disposed between the encapsulation layer 300 and the first touch electrode layer 510, and a light control film 524 disposed between the barrier film 522 and the first touch electrode layer 510.

The barrier film 522 may be disposed between the encapsulation layer 300 and the light control film 524. That is, the barrier film 522 may be adhered to the whole top of the encapsulation layer 300 by the first transparent adhesive 521 to cover the encapsulation layer 300. In this case, the bottom of the barrier film 522 may be adhered to the encapsulation layer 300 by the first transparent adhesive 521, and the top of the barrier film 522 may be directly coupled to a bottom of the light control film 524 by a second transparent adhesive 523.

The light control film 524 may be adhered to the top of the barrier film 522 by the second transparent adhesive 523 to cover the whole top of the barrier film 522. In this case, the bottom of the light control film 524 may be adhered to the top of the barrier film 522 by the second transparent adhesive 523, and a top of the light control film 524 may be directly coupled to the bottom of the first touch electrode layer 510. Also, the light control film 524 enhances the luminance characteristic of the light emitted from each pixel SP. For example, the light control film 524 may be a polarizing film that polarizes the light emitted from each pixel SP, but may be an optical film for enhancing the luminance characteristic of the light emitted from each pixel SP without being limited thereto.

In the function layer 520 according to various embodiments, the barrier film 522 may be formed by coating an inorganic insulating material on an organic insulation film. The barrier film 522 is for primarily preventing water or oxygen from penetrating into each pixel SP and may be formed of a material which is low in water vapor transmission rate. In addition, the barrier film 522 may act as a supporter that supports the bottom of the first touch electrode layer 510 in order for a touch force of a user to be applied to the pressure reaction member 550. Also, the barrier film 522 may relax an impact which is applied to the organic light emitting display device due to the touch force of the user, thereby preventing damage of the organic light emitting device ED.

Furthermore, in the organic light emitting display device according to the present embodiment, a second touch electrode layer 530 may have a structure which is the same as that of the second touch electrode layer illustrated in FIG. 6.

Since the organic light emitting display device according to the present embodiment includes the barrier film 522, the organic light emitting display device according to the present embodiment has the same effects as those of the organic light emitting display device illustrated in FIGS. 1 to 7, and moreover, the organic light emitting device ED is more stably prevented from being damaged by an impact and water or oxygen.

Figure 8:
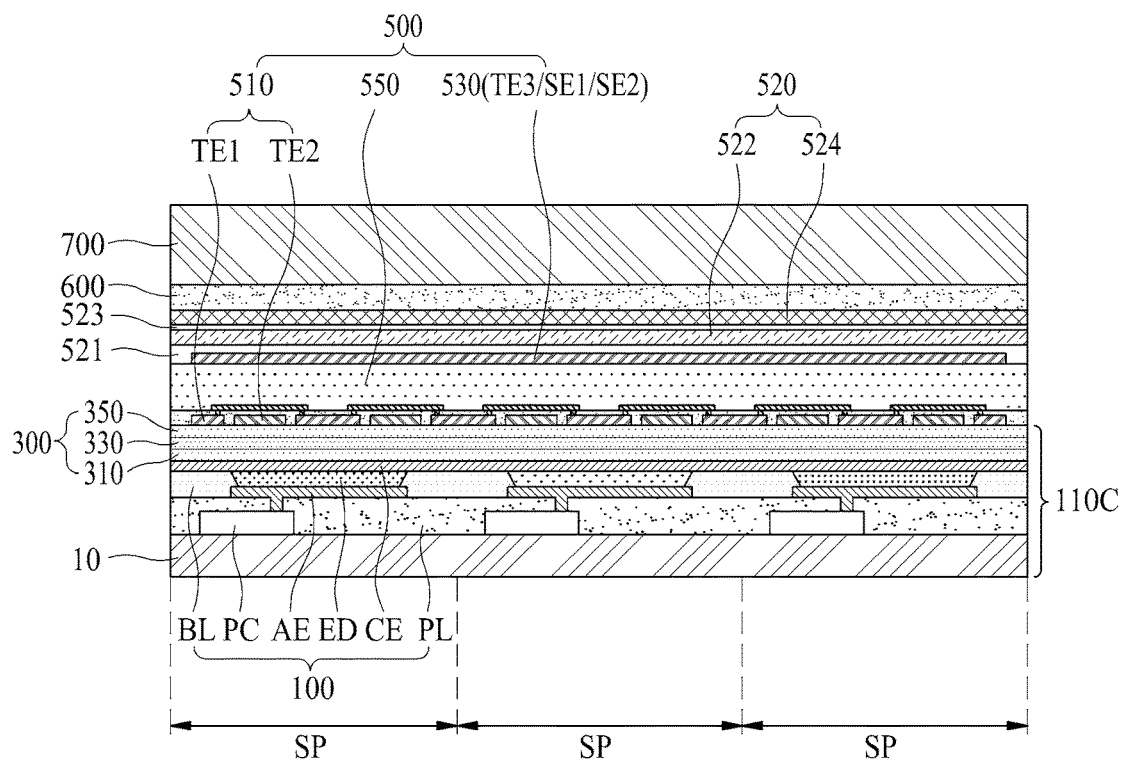
FIG. 8 is a cross-sectional view for describing an organic light emitting display device according to another embodiment.

FIG. 8 is a cross-sectional view for describing an organic light emitting display device according to another embodiment and is configured by changing a position of the function layer in the organic light emitting display device illustrated in FIG. 7. Therefore, only a function layer and elements relevant thereto will be described.

Referring to FIG. 8, in the organic light emitting display device according to the present embodiment, except that a function layer 520 is not included in the display layer 110C but instead is disposed between a touch sensing layer 500 and a cover window 700 so as to additionally prevent the touch sensing layer 500 from being damaged by external water or oxygen, the function layer 520 according to the present embodiment may have the same configuration as that of the function layer 520 illustrated in FIG. 7. Therefore, only a configuration and an arrangement structure of the function layer 520 will be described.

The function layer 520 according to one or more embodiments may include a barrier film 522 disposed between the touch sensing layer 500 and the cover window 700.

The barrier film 522 according to an embodiment may be adhered to a whole top of the touch sensing layer 500 by a first transparent adhesive 521 to cover the whole top of the touch sensing layer 500. In this case, a bottom of the barrier film 522 may be coupled to a second touch electrode layer 530 of the touch sensing layer 500 by the first transparent adhesive 521, and a top of the barrier film 522 may be directly coupled to the cover window 700, namely, an optical adhesive member 600.

According to one or more embodiments, the function layer 520 may include the barrier film 522, disposed between the touch sensing layer 500 and the cover window 700, and a light control film 524 disposed between the barrier film 522 and the cover window 700.

The barrier film 522 may be disposed between the touch sensing layer 500 and the light control film 524. That is, the barrier film 522 may be adhered to the whole top of the touch sensing layer 500 by the first transparent adhesive 521 to cover a whole top of the touch sensing layer 500. In this case, the bottom of the barrier film 522 may be coupled to the second touch electrode layer 530 of the touch sensing layer 500 by the first transparent adhesive 521, and the top of the barrier film 522 may be directly coupled to a bottom of the light control film 524 by a second transparent adhesive 523.

The light control film 524 may be adhered to the top of the barrier film 522 by the second transparent adhesive 523 to cover the whole top of the barrier film 522. In this case, the bottom of the light control film 524 may be adhered to the top of the barrier film 522 by the second transparent adhesive 523, and a top of the light control film 524 may be directly coupled to the bottom of the cover window 700, namely, the optical adhesive member 600. Also, the light control film 524 enhances the luminance characteristic of light emitted from each pixel SP. For example, the light control film 524 may be a polarizing film that polarizes the light emitted from each pixel SP.

In the function layer 520 according to various embodiments, the barrier film 522 may be formed by coating an inorganic insulating material on an organic insulation film. The barrier film 522 is for primarily preventing water or oxygen from penetrating into each pixel SP and may be formed of a material which is low in water vapor transmission rate. Also, the barrier film 522 may relax an impact which is applied to the organic light emitting display device due to the touch force of the user, thereby preventing an organic light emitting device ED from being damaged by the impact and additionally preventing the touch sensing layer 500 from being damaged by water or oxygen.

Furthermore, in the organic light emitting display device according to the present embodiment, the second touch electrode layer 530 may have a structure which is the same as that of the second touch electrode layer illustrated in FIG. 6.

Since the organic light emitting display device according to the present embodiment includes the barrier film 522, the organic light emitting display device according to the present embodiment has the same effects as those of the organic light emitting display device illustrated in FIGS. 1 to 6, and moreover, the first touch electrode layer 510 is additionally prevented from being damaged by water or oxygen.

Figure 9:
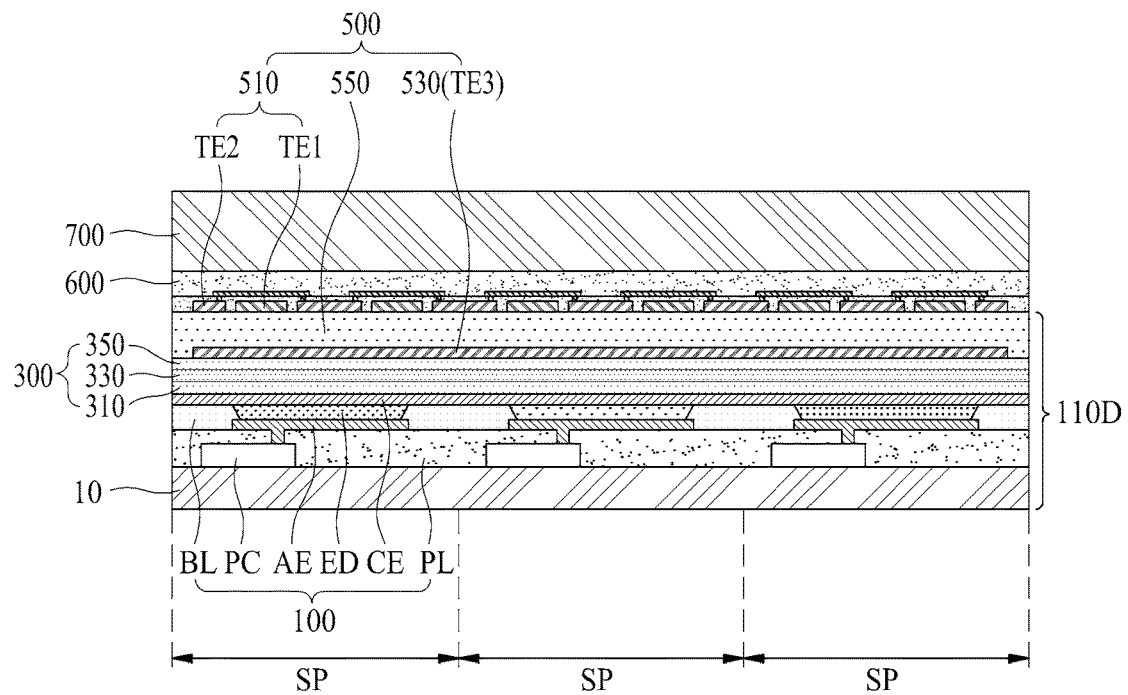
FIG. 9 is a cross-sectional view for describing an organic light emitting display device according to another embodiment.
Figure 10:
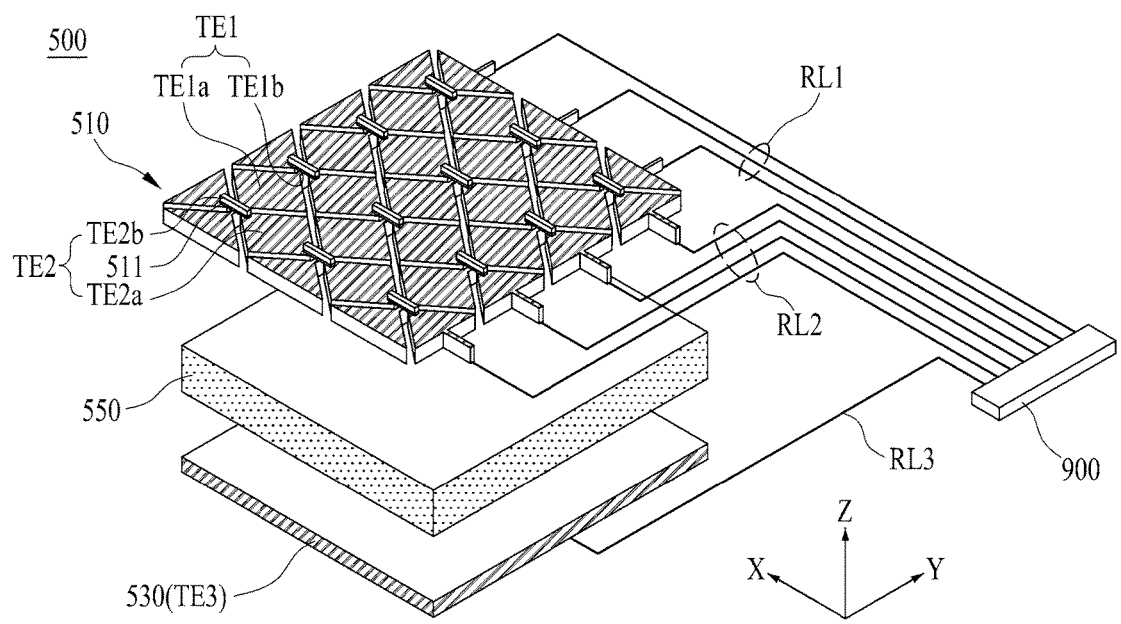
FIG. 10 is a diagram for describing a touch sensing layer illustrated in FIG. 9.

FIG. 9 is a cross-sectional view for describing an organic light emitting display device according to another embodiment, and FIG. 10 is a diagram for describing a touch sensing layer illustrated in FIG. 9. The drawings illustrate the organic light emitting display device configured by changing positions of the first and second touch electrode layers in the touch sensing layer illustrated in FIG. 1. Similarly to the display layer 110A in the embodiment shown in FIG. 2, the display layer 110D in this embodiment shown in FIG. 9 includes the substrate 10, the pixel array layer 100, and the encapsulation layer 300. Therefore, only a touch sensing layer will be described.

Referring to FIGS. 9 and 10, a touch sensing layer 500 of the organic light emitting display device according to the present embodiment may include a first touch electrode layer 530 provided on an encapsulation layer 300, a second touch electrode layer 510 provided on the first touch electrode layer 530, and a pressure reaction member 550 disposed between the first touch electrode layer 530 and the second touch electrode layer 510.

The second touch electrode layer 510 may include a plurality of first touch electrodes TE1 and a plurality of second touch electrodes TE2, which are directly coupled to a top of the pressure reaction member 550. The second touch electrode layer 510 corresponds to the first touch electrode layer illustrated in FIGS. 1 to 3. Except that the plurality of first touch electrodes TE1 and the plurality of second touch electrodes TE2 are directly provided on the top of the pressure reaction member 550, the second touch electrode layer 510 according to the present embodiment has the same configuration as that of the first touch electrode layer illustrated in FIGS. 1 to 3, and thus, its detailed description is not provided.

The first touch electrode layer 530 according to an embodiment may include one touch electrode TE3 which is directly coupled to a top of the encapsulation layer 300 and is provided to overlap the plurality of second touch electrodes TE2 and the plurality of first touch electrodes TE1. The first touch electrode layer 530 corresponds to the second touch electrode layer illustrated in FIGS. 1 to 3. Except that the first touch electrode layer 530 includes the one touch electrode TE3 and is directly provided on a top of the encapsulation layer 300, the first touch electrode layer 530 according to the present embodiment has the same configuration as that of the second touch electrode layer illustrated in FIGS. 1 to 3, and thus, its detailed description is not provided.

In one embodiment, since the first touch electrode layer 530 includes a single third touch electrode TE3 rather than a plurality of third touch electrodes TE3, a single touch force may be sensed. That is, in an embodiment in which the organic light emitting display device includes the plurality of third touch electrodes TE3, a touch force and a touch position may be simultaneously sensed for each of two or more different touch areas. In an embodiment in which a single third touch electrode TE3 is included in the first touch electrode layer 530, a multi-touch position may be sensed through the first and second touch electrodes TE1 and TE2 of the second touch electrode layer 510, and a single touch force may be sensed through the single third touch electrode TE3 and the second touch electrodes TE2, hence a touch force sensing time can be reduced.

In addition, the first touch electrode layer 530 according to the present embodiment may include at least one third touch electrode TE3 as in the organic light emitting display device illustrated in FIGS. 1 to 9, for sensing a multi-touch force. Furthermore, the first touch electrode layer 530 may further include the above-described connection secondary electrode for enlarging an overlapping area between each of the plurality of third touch electrodes TE3 and the second touch electrode TE2 in sensing a touch force.

The organic light emitting display device according to the present embodiment may further include the function layer 520 illustrated in FIG. 7 or 8.

In the organic light emitting display device according to the present embodiment, the first touch electrode layer 510 may be disposed closer to a touch surface than the second touch electrode layer 530, and thus, a sensitivity of touch position sensing is enhanced.

Figure 11:
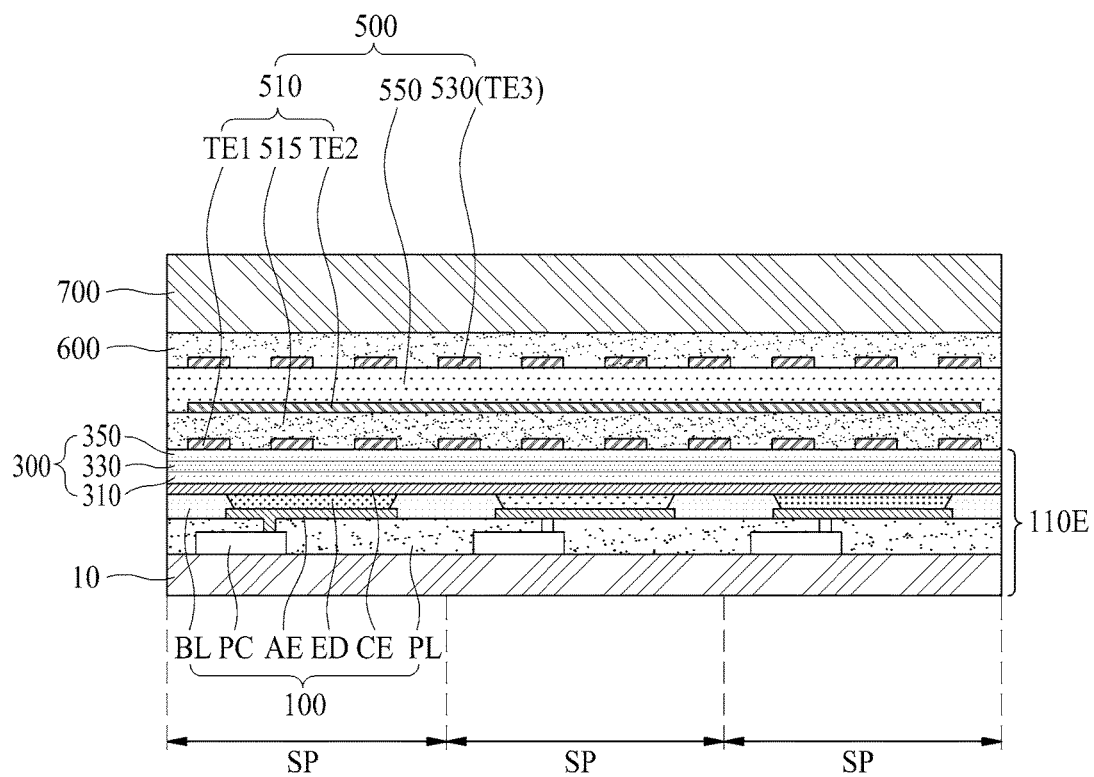
FIG. 11 is a cross-sectional view for describing an organic light emitting display device according to an embodiment.
Figure 12:
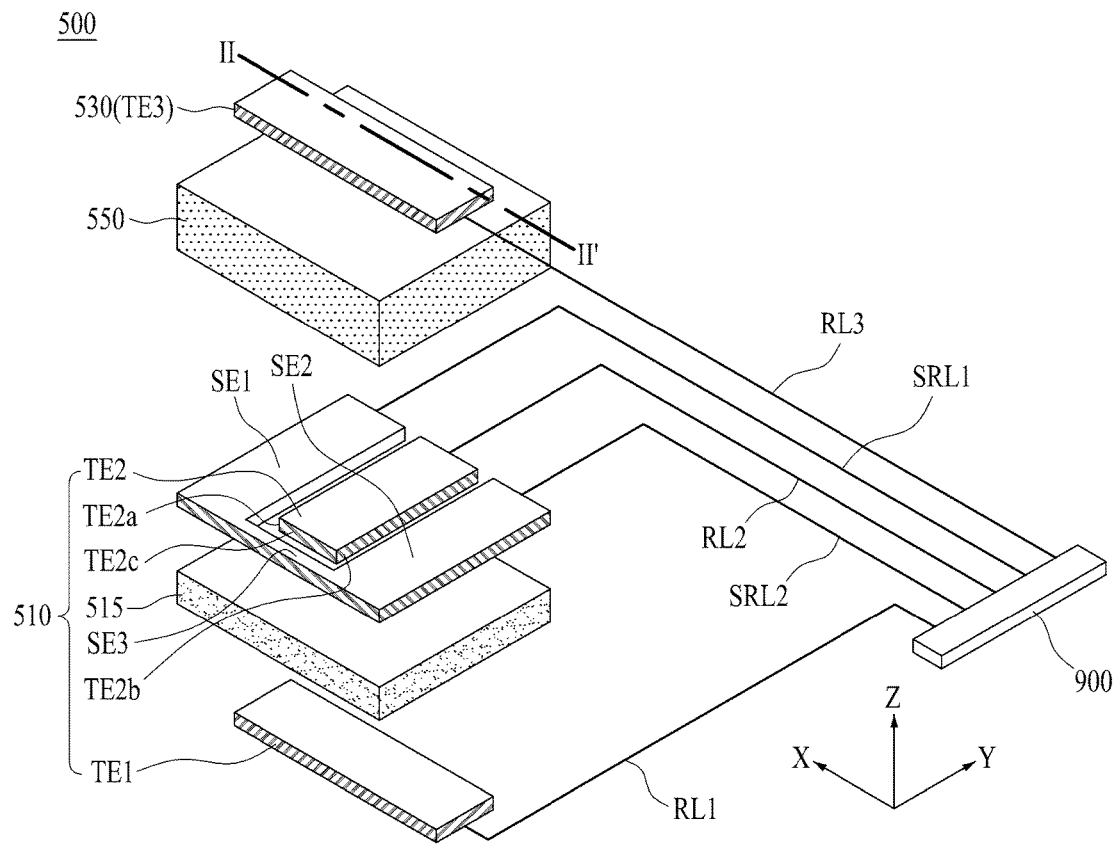
FIG. 12 is a diagram for describing a configuration of a touch sensing layer illustrated in FIG. 11.
Figure 13:
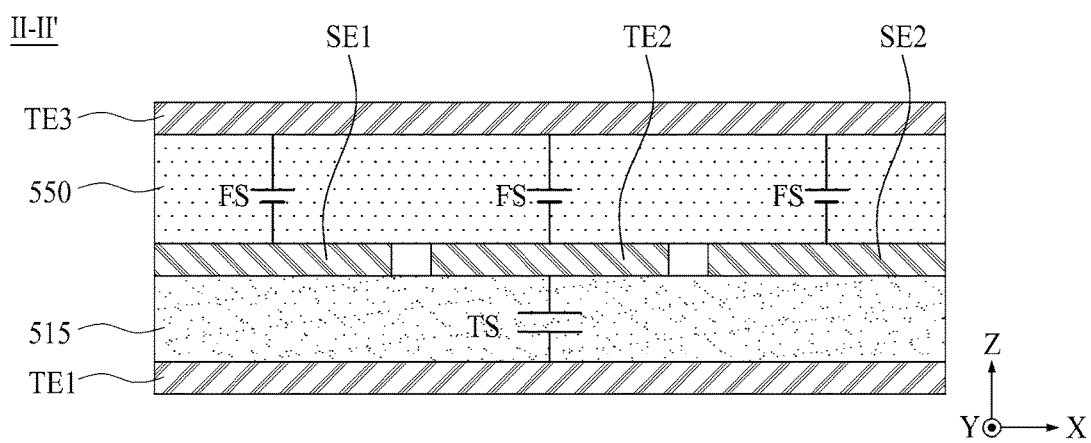
FIG. 13 is a cross-sectional view taken along line II-II' illustrated in FIG. 12.

FIG. 11 is a cross-sectional view for describing an organic light emitting display device according to an embodiment. FIG. 12 is a diagram for describing a configuration of a touch sensing layer illustrated in FIG. 12. FIG. 13 is a cross-sectional view taken along line II-II' illustrated in FIG. 12. The organic light emitting display device according to the present embodiment is configured by changing the first touch electrode layer illustrated in FIG. 1. Similarly to the display layer 110A in the embodiment shown in FIG. 2, the display layer 110E in this embodiment shown in FIG. 11 includes the substrate 10, the pixel array layer 100, and the encapsulation layer 300. Therefore, only a first touch electrode layer and elements relevant thereto will be described.

Referring to FIGS. 11 to 13, in the organic light emitting display device according to the present embodiment, a first touch electrode layer 510 may include a plurality of first touch electrodes TE1 directly coupled to a top of an encapsulation layer 300, an electrode insulation layer 515 provided on the encapsulation layer 300 to cover the plurality of first touch electrodes TE1, and a plurality of second touch electrodes TE2 which are directly coupled to a top of the electrode insulation layer 515 and intersect the plurality of first touch electrodes TE1.

The plurality of first touch electrodes TE1 may be directly formed on the top of the encapsulation layer 300 and may each act as a first touch driving electrode for sensing a touch position based on a user touch. The plurality of first touch electrodes TE1 may be spaced apart from each other by a certain interval along a second horizontal axis direction Y of the substrate 10 and may be directly formed on the top of the encapsulation layer 300 in parallel with a first horizontal axis direction X of the substrate 10. Each of the plurality of first touch electrodes TE1 according to an embodiment may be provided in a bar shape which extends along the first horizontal axis direction X.

Each of the plurality of first touch electrodes TE1 may be connected to a touch driving circuit 900 through a corresponding first routing line among a plurality of first routing lines RL1 provided on the substrate 10. The plurality of first touch electrodes TE1 may receive a first touch driving pulse supplied from the touch driving circuit 900 during a first touch sensing period. During a second touch sensing period, the plurality of first touch electrodes TE1 may be electrically floated by the touch driving circuit 900.

The electrode insulation layer 515 may be provided on the encapsulation layer 300 to cover the plurality of first touch electrodes TE1.

The plurality of second touch electrodes TE2 may be directly formed on a top of the electrode insulation layer 515 and may each act as a touch sensing electrode for sensing a touch based on a user touch. The plurality of second touch electrodes TE2 may be directly provided on the top of the electrode insulation layer 515 and may be arranged at certain intervals along the first horizontal axis direction X of the substrate 10 in parallel with the second horizontal axis direction Y of the substrate 10. That is, each of the plurality of second touch electrodes TE2 may be provided in a bar shape which extends along the second horizontal axis direction Y of the substrate 10 to intersect each of the plurality of first touch electrodes TE1.

The plurality of first touch electrodes TE1 and the plurality of second touch electrodes TE2 may intersect each other with the electrode insulation layer 515 therebetween, and thus, a touch sensor TS including a mutual capacitance may be provided in the electrode insulation layer 515 and at each of intersection portions of the plurality of first touch electrodes TE1 and the plurality of second touch electrodes TE2. An electric charge may be charged into the mutual capacitance of touch sensor TS according to the first touch driving pulse applied to the first touch electrode TE1, and the charged electric charge may vary according to whether a user touch is made. Therefore, a touch position may be sensed by using a touch position calculation algorithm which models a reduction in mutual capacitance included in the touch sensor TS, based on a user touch.

Optionally, the plurality of first touch electrodes TE1 and the plurality of third touch electrodes TE3 may be exchanged in their disposed positions. That is, similarly to FIG. 10, the plurality of third touch electrodes TE3 may be directly provided on the top of the encapsulation layer 300, and the plurality of first touch electrodes TE1 may be directly provided on the top of the pressure reaction member 550.

The pressure reaction member 550 may be disposed between the first touch electrode layer 510 and the second touch electrode layer 530 and may be formed of a material which is the same as that of the pressure reaction member illustrated in FIG. 2.

The pressure reaction member 550 may be disposed between the plurality of second touch electrodes TE2 and the plurality of third touch electrodes TE3, thereby providing a force sensor FS between the second touch electrodes TE2 and the third touch electrodes TE3.

The force sensor FS according to an embodiment may have a voltage based on a piezoelectric effect based on an elasticity change of the pressure reaction member 550 caused by a touch force of a user. In this case, as pressure based on the touch force of the user becomes higher, the voltage of the force sensor FS may increase, and thus, a touch force level may be sensed by using a touch force level calculation algorithm which models a voltage increase rate of the force sensor FS, based on the touch force of the user.

According to another embodiment, the force sensor FS may a resistance value based on a piezoresistive effect based on an elasticity change of the pressure reaction member 550 caused by a touch force of a user. In this case, as pressure based on the touch force of the user becomes higher, the resistance of the force sensor FS may be reduced, and thus, a touch force level may be sensed by using a touch force level calculation algorithm which models a voltage variation rate with respect to a resistance reduction rate of the force sensor FS, based on the touch force of the user.

The pressure reaction member 550 may act as a haptic output device in a haptic mode. That is, as described above, the haptic mode according to an embodiment may include a vibration haptic mode based on a vibration of the pressure reaction member 550 and an electrostatic haptic mode based on an electrostatic force of the pressure reaction member 550.

The first touch electrode layer 510 according to the present embodiment may include a plurality of secondary electrodes SE1 and SE2 which are provided along with the plurality of second touch electrodes TE2 and are disposed adjacent to at least one of one side TE2a and the other side TE2b of each of the plurality of second touch electrodes TE2.

The first touch electrode layer 510 according to the present embodiment may include a plurality of first secondary electrodes SE1, which are provided adjacent to and in parallel with the one side TE2a of each of the second touch electrodes TE2, and a plurality of second secondary electrodes SE2 which are provided adjacent to and in parallel with the other side TE2b of each of the second touch electrodes TE2. Each of the plurality of first and second secondary electrodes SE1 and SE2 may have a shape which is the same as that of each of the second touch electrodes TE2.

Each of the plurality of first secondary electrodes SE1 may be connected to the touch driving circuit 900 through a corresponding first secondary routing line among a plurality of first secondary routing lines SRL1, and each of the plurality of second secondary electrodes SE2 may be connected to the touch driving circuit 900 through a corresponding second secondary routing line among a plurality of second secondary routing lines SRL2. Each of the plurality of first and second secondary electrodes SE1 and SE2 may be floated by the touch driving circuit 900 or may be electrically connected to the second touch electrode TE2 or the second routing line RL2 adjacent thereto.

In detail, a mutual capacitance of the touch sensor TS provided the electrode insulation layer 515 between the first touch electrode TE1 and the second touch electrode TE2 intersecting each other may be reduced as an area of the second touch electrode TE2 overlapping the first touch electrode TE1 is enlarged, and thus, it is difficult to sense a touch position of a user. Accordingly, the plurality of first secondary electrodes SE1 and the plurality of second secondary electrodes SE2 may decrease an area of the second touch electrode TE2 overlapping the first touch electrode TE1 during the first touch sensing period, and thus, may be electrically floated for effectively providing the mutual capacitance of the touch sensor TS.

On the other hand, a voltage or a resistance of the force sensor FS provided in the pressure reaction member 550 between the third touch electrode TE3 and the second touch electrode TE2 intersecting each other may increase as an overlapping area between the first touch electrode TE1 and the second touch electrode TE2 is enlarged, with respect to the same pressure. Accordingly, the plurality of first secondary electrodes SE1 and the plurality of second secondary electrodes SE2 may be electrically connected to the second touch electrode TE adjacent thereto during the second touch sensing period, and thus, an overlapping area between the second touch electrode TE2 and the third touch electrode TE3 may be enlarged, thereby enhancing an efficiency of touch force sensing.

The plurality of first secondary electrodes SE1 and the plurality of second secondary electrodes SE2 may be used as a touch force sensing electrode for sensing a touch force and may be used as a floating electrode which enables a touch position to be sensed.

Moreover, one side of each of the first and second secondary electrodes SE1 and SE2 may be electrically connected to each other by a connection secondary electrode SE3.

The connection secondary electrode SE3 may be spaced apart from one end (for example, one short side TE2c) of the second touch electrode TE2 and may be provided in parallel with the one short side TE2c, and moreover, the connection secondary electrode SE3 may electrically connect one ends of the first and second secondary electrodes SE1 and SE2 which are parallel to each other with an adjacent second touch electrode TE2 therebetween. Therefore, the connection secondary electrode SE3 may connect one ends of the first and second secondary electrodes SE1 and SE2 which are adjacent to one side TE2a and the other side TE2b of the second touch electrode TE2. That is, each of the plurality of first second electrodes SE1 may be provided adjacent to one side of a corresponding second touch electrode TE2. The connection secondary electrode SE3 may be provided in plurality. Each of the plurality of connection secondary electrodes SE3 may be spaced apart from the one short side TE2c of the second touch electrode TE2 adjacent thereto, may be parallel to the one short side TE2c, and may extend from one end of a corresponding first secondary electrode SE1. Also, each of the plurality of second secondary electrodes SE2 may be adjacent to the other side of a corresponding second touch electrode TE2 and may extend from an end of a corresponding connection secondary electrode SE3. Therefore, a plurality of secondary electrodes which include the plurality of first secondary electrodes SE1, the plurality of connection secondary electrodes SE3, and the plurality of second secondary electrodes SE2 may be electrically connected to each other, may be provided on the same layer, and may have a ⊂-shape or a ⊃-shape, thereby surrounding sides of the second touch electrode TE2 other than the other short side of the second touch electrode TE2. Here, the other short side of the second touch electrode TE2 may be defined as a portion connected to the secondary routing line SRL.

In addition, in FIG. 12, each of the plurality of first secondary electrodes SE1 and the plurality of second secondary electrodes SE2 is illustrated as having a bar shape, but is not limited thereto. In other embodiments, in order to increase a transmittance of light emitted from each pixel SP, each of the plurality of first secondary electrodes SE1 and the plurality of second secondary electrodes SE2 may be formed in a plurality of line structures, mesh structures, or trapezoid structures which are electrically connected to each other, or may include a plurality of openings which are arranged at certain intervals in a slit or lattice type.

In the organic light emitting display device according to the present embodiment, the touch driving circuit 900 may be connected to the plurality of first touch electrodes TE1, the plurality of second touch electrodes TE2, and the plurality of third touch electrodes TE3. That is, the touch driving circuit 900 may be connected to the plurality of first touch electrodes TE1, the plurality of second touch electrodes TE2, and the plurality of third touch electrodes TE3 through the plurality of first to third routing lines RL1, RL2 and RL3 provided on the substrate 10 in a one-to-one relationship and may be connected to the plurality of first and second secondary electrodes SE1 and SE2 through the plurality of first and second secondary routing lines SRL1 and SRL2 provided on the substrate 10 in a one-to-one relationship.

The touch driving circuit 900 according to the present embodiment may time-divisionally drive the touch sensing layer 500 in the first touch sensing period and the second touch sensing period in response to a touch mode signal supplied from a host control circuit, and in each of the first touch sensing period and the second touch sensing period, when a touch event occurs, the touch driving circuit 900 may drive the touch sensing layer 500 in a haptic mode.

Figure 14A:
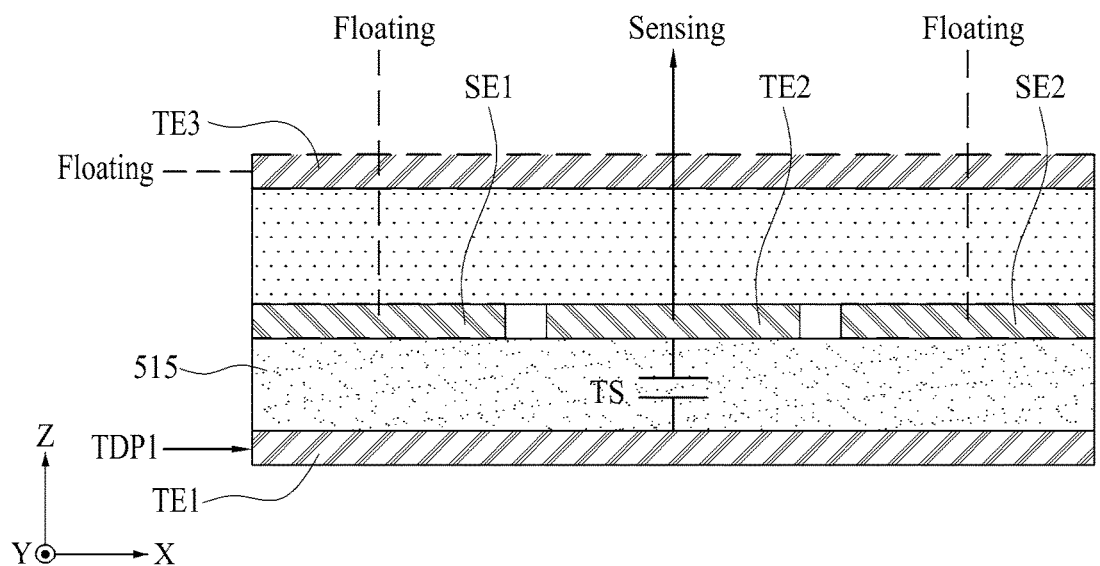
FIGS. 14A and 14B are cross-sectional views for describing a driving method of an organic light emitting display device according to another embodiment.

During the first touch sensing period, as illustrated in FIG. 14A, the touch driving circuit 900 may electrically float the plurality of third touch electrodes TE3 and the plurality of first and second secondary electrodes SE1 and SE2, apply a first touch driving pulse TDP1 to at least one of the plurality of first touch electrodes TE1, and sense a mutual capacitance variation between the first and second touch electrodes TE1 and TE2 caused by a user touch through the plurality of second touch electrodes TE2 to generate a first touch sensing signal. For example, during the first touch sensing period, the touch driving circuit 900 may sequentially apply the first touch driving pulse TDP1 to the plurality of first touch electrodes TE1 and may sense the mutual capacitance variation of the touch sensor TS, provided between the first touch electrode TE1 to which the first touch driving pulse TDP1 is applied and the second touch electrode TE2 overlapping the first touch electrode TE1, through the plurality of second touch electrodes TE2 to generate the first touch sensing signal.

Figure 14B:
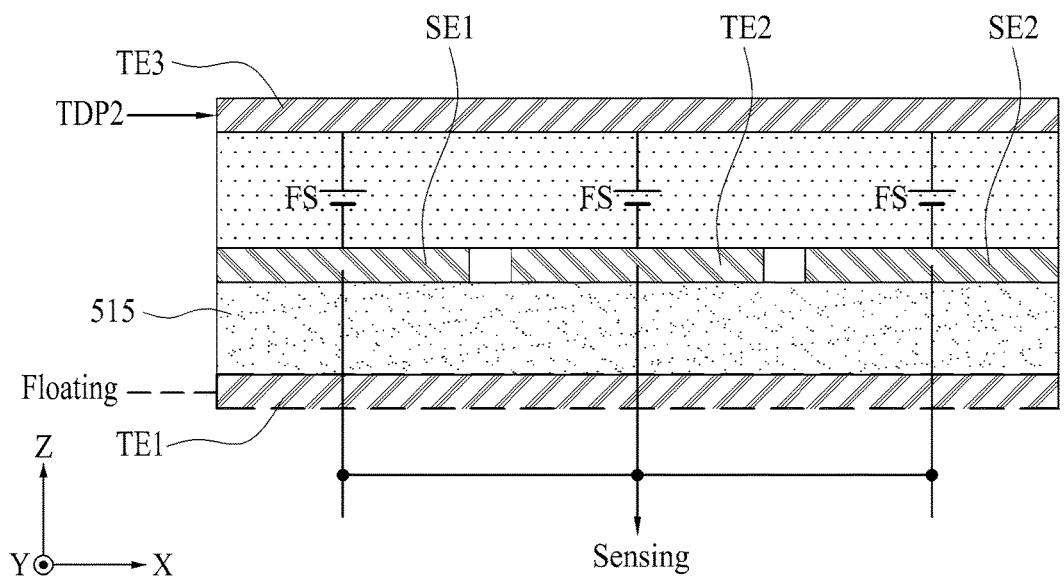

During the second touch sensing period, as illustrated in FIG. 14B, the touch driving circuit 900 may electrically float the plurality of first touch electrodes TE1, apply a second touch driving pulse TDP2 to at least one of the plurality of third touch electrodes TE3, and sense a voltage variation of the force sensor FS, caused by a user touch, through the plurality of second touch electrodes TE2 to generate a second touch sensing signal. For example, during the second touch sensing period, the touch driving circuit 900 may sequentially apply the second touch driving pulse TDP2 to the plurality of third touch electrodes TE3 and may sense a voltage variation (or a resistance variation) of the force sensor FS, provided between the third touch electrode TE3 to which the second touch driving pulse TDP2 is applied and the second touch electrode TE2 overlapping the third touch electrode TE3, through the plurality of second touch electrodes TE2 to generate the second touch sensing signal.

In addition, the touch driving circuit 900 may determine the presence of a touch event to calculate a touch event area, based on the first touch sensing signal generated through sensing during the first touch sensing period, apply the second touch driving pulse TDP2 to at least one third touch electrode TE3 provided in the touch event area during the second touch sensing period, and sense a voltage variation (or a resistance variation) of the force sensor FS of the pressure reaction member 550, caused by a touch force of a user, through the plurality of second touch electrodes TE2 to generate the second touch sensing signal. Subsequently, based on the second touch sensing signal, the touch driving circuit 900 may calculate touch position coordinates to output the touch position coordinates to the host control circuit, or may calculate a touch force level and touch position coordinates to output the touch force level and the touch position coordinates to the host control circuit. That is, in the present embodiment, during the second touch sensing period, touch force sensing may be locally performed on a touch event area which is calculated through sensing in the first touch sensing period, thereby shortening a touch force sensing time for which a touch force of a user is sensed.

According to another embodiment, as illustrated in FIG. 14B, during the second touch sensing period, the touch driving circuit 900 may electrically float the plurality of first touch electrodes TE1, connect each of the plurality of first and second secondary electrodes SE1 and SE2 to the second touch electrode TE2 adjacent thereto, apply the second touch driving pulse TDP2 to at least one of the plurality of third touch electrodes TE3, and sense a voltage variation (or a resistance variation) of the force sensor FS of the pressure reaction member 550, caused by a touch force of a user, through the plurality of second touch electrodes TE2 to generate the second touch sensing signal. In this case, each of the plurality of second touch electrodes TE2 respectively overlapping the plurality of third touch electrodes TE3 may be electrically connected to the first and second secondary electrodes SE1 and SE2 adjacent thereto, and thus, an overlapping area between the third touch electrode TE3 and the second touch electrode TE2 increases by an area of the first and second secondary electrodes SE1 and SE2. Therefore, a voltage (or a resistance) generated in the force sensor FS may further vary by an area of the first and second secondary electrodes SE1 and SE2 connected to the second touch electrode TE2, and thus, in present embodiment, a voltage variation (or a resistance variation) occurring in the force sensor FS is more easily sensed.

In addition, since the pressure reaction member 550 is disposed between the first touch electrode layer 510 and the second touch electrode layer 530, the pressure reaction member 550 may act as a haptic output device. That is, the organic light emitting display device according to the present embodiment may realize the haptic mode by using the pressure reaction member 550. The haptic mode according to an embodiment may include a vibration haptic mode based on a vibration of the pressure reaction member 550 and an electrostatic haptic mode based on an electrostatic force of the pressure reaction member 550. The haptic mode is as described above, and thus, its detailed description is not repeated.

As described above, since the touch sensing layer 500 is directly provided in the organic light emitting display panel, the organic light emitting display device according to an embodiment has a thin thickness despite including the touch panel. The organic light emitting display device may sense a capacitance variation caused by a user touch to sense a touch position by the user, and may sense a voltage or resistance variation of the pressure reaction member 550 caused by a touch force of the user to sense a touch force of the user. Also, in the organic light emitting display device according to an embodiment, the first and second secondary electrodes SE1 and SE2 may be connected to the second touch electrode TE2 when sensing the touch force of the user, and thus, an area of the second touch electrode TE2 overlapping the third touch electrode TE3 increases, thereby increasing an efficiency of touch force sensing.

Optionally, in the organic light emitting display device according to the present embodiment, the plurality of first touch electrodes TE1 and the plurality of third touch electrodes TE3 may be exchanged in their disposed positions. In this case, similarly to FIG. 11, the plurality of third touch electrodes TE3 directly provided on a top of the encapsulation layer 300 may be configured as one third touch electrode TE3.

Figure 15:
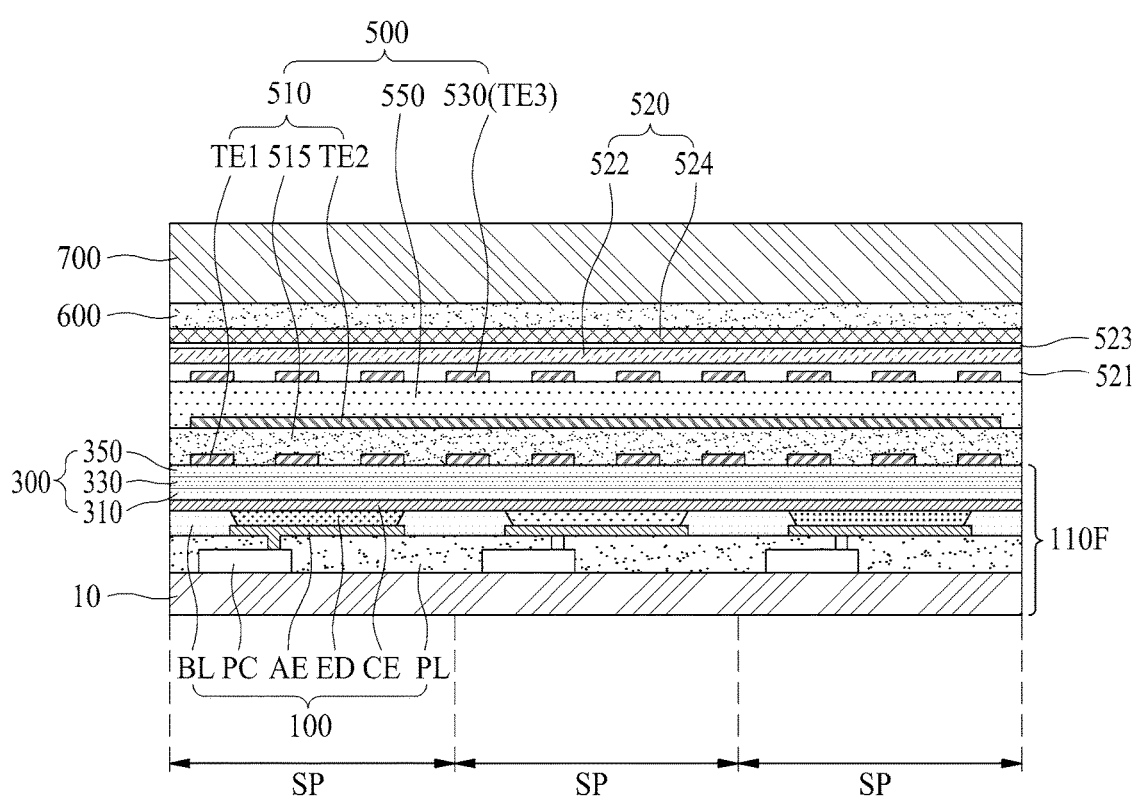
FIG. 15 is a cross-sectional view for describing an organic light emitting display device according to another embodiment.

FIG. 15 is a cross-sectional view for describing an organic light emitting display device according to another embodiment and is configured by adding a function layer to the organic light emitting display device illustrated in FIG. 11. Similarly to the display layer 110A in the embodiment shown in FIG. 2, the display layer 110F in this embodiment shown in FIG. 15 includes the substrate 10, the pixel array layer 100, and the encapsulation layer 300. Therefore, only a function layer and elements relevant thereto will be described.

Referring to FIG. 15, in the organic light emitting display device according to the present embodiment, a function layer 520 may be disposed between a touch sensing layer 500 and a cover window 700. The function layer 520 is for preventing an organic light emitting device ED as well as the first touch electrode layer 510 from being damaged by external water or oxygen, and may have the same configuration as that of the function layer 520 illustrated in FIG. 8. Therefore, only a configuration and an arrangement structure of the function layer 520 will be described.

The function layer 520 according to one or more embodiments may include a barrier film 522 disposed between the touch sensing layer 500 and the cover window 700.

The barrier film 522 according to an embodiment may be adhered to a whole top of the touch sensing layer 500 by a first transparent adhesive 521 to cover the whole top of the touch sensing layer 500. In this case, a bottom of the barrier film 522 may be coupled to a second touch electrode layer 530 of the touch sensing layer 500 by the first transparent adhesive 521, and a top of the barrier film 522 may be directly coupled to the cover window 700, namely, an optical adhesive member 600.

According to one or more embodiments, the function layer 520 may include the barrier film 522, disposed between the touch sensing layer 500 and the cover window 700, and a light control film 524 disposed between the barrier film 522 and the cover window 700.

The barrier film 522 may be disposed between the touch sensing layer 500 and the light control film 524. That is, the barrier film 522 may be adhered to the whole top of the touch sensing layer 500 by the first transparent adhesive 521 to cover the whole top of the touch sensing layer 500. In this case, the bottom of the barrier film 522 may be adhered to the second touch electrode layer 530 of the touch sensing layer 500 by the first transparent adhesive 521, and the top of the barrier film 522 may be directly coupled to a bottom of the light control film 524 by a second transparent adhesive 523.

The light control film 524 may be adhered to the top of the barrier film 522 by the second transparent adhesive 523 to cover the whole top of the barrier film 522. In this case, the bottom of the light control film 524 may be adhered to the top of the barrier film 522 by the second transparent adhesive 523, and a top of the light control film 524 may be directly coupled to the cover window 700, namely, the optical adhesive member 600. Also, the light control film 524 enhances the luminance characteristic of light emitted from each pixel SP. For example, the light control film 524 may be a polarizing film that polarizes the light emitted from each pixel SP.

In the function layer 520 according to various embodiments, the barrier film 522 may be formed by coating an inorganic insulating material on an organic insulation film. The barrier film 522 is for primarily preventing water or oxygen from penetrating into each pixel SP and may be formed of a material which is low in water vapor transmission rate. Also, the barrier film 522 may act as a supporter that supports the bottom of the pressure reaction member 550 in order for a thickness of the pressure reaction member 550 to be modified based on a touch force of a user. Also, the barrier film 522 may relax an impact which is applied to the organic light emitting display device due to the touch force of the user, thereby preventing an organic light emitting device ED from being damaged by the impact and additionally preventing the touch sensing layer 500 from being damaged by water or oxygen.

Since the organic light emitting display device according to the present embodiment includes the barrier film 522, the organic light emitting display device according to the present embodiment has the same effects as those of the organic light emitting display device illustrated in FIG. 11, and moreover, the organic light emitting device ED as well as the touch sensing layer 500 can be additionally prevented from being damaged by an impact and water or oxygen.

Optionally, in the organic light emitting display device according to the present embodiment, the plurality of first touch electrodes TE1 and the plurality of third touch electrodes TE3 may be exchanged in their disposed positions. In this case, similarly to FIG. 10, the plurality of third touch electrodes TE3 directly provided on a top of the encapsulation layer 300 may be configured as one third touch electrode TE3.

Figure 16:
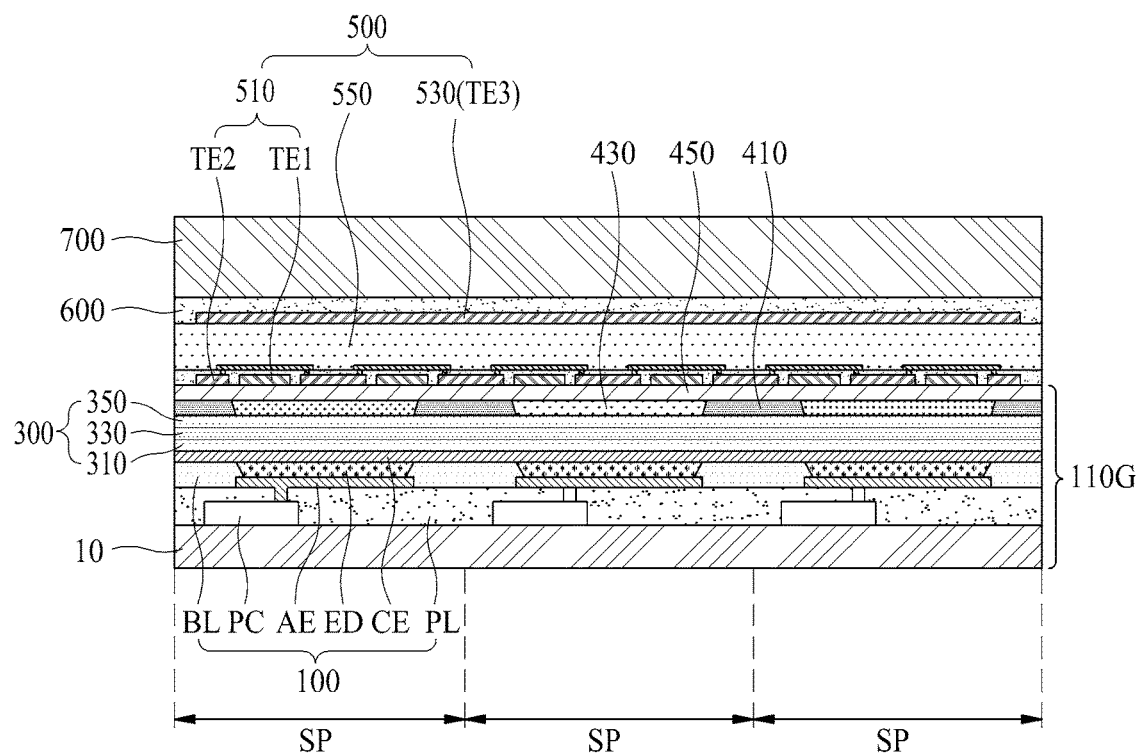
FIG. 16 is a cross-sectional view for describing an organic light emitting display device according to another embodiment.

FIG. 16 is a cross-sectional view for describing an organic light emitting display device according to another embodiment and is configured by adding a black matrix, a color filter layer, and a buffer layer to the organic light emitting display device illustrated in FIG. 1.

Referring to FIG. 16, the organic light emitting display device according to the present embodiment may include (i) a display layer 110G including a substrate 10, a pixel array layer 100, an encapsulation layer 300, a black matrix 410, a color filter layer 430, and a buffer layer 450, (ii) a touch sensing layer 500, (iii) an optical adhesive member 600, (iv) a cover window 700, and (v) a touch driving circuit 900.

Except that the organic light emitting device ED of each pixel SP provided in the pixel array layer 100 emits white light in the organic light emitting display device illustrated in FIG. 1, the substrate 10, the pixel array layer 100, and the encapsulation layer 300 are the same as the illustration in FIG. 1, and thus, their detailed descriptions are not repeated.

The black matrix 410 may define an opening area of each pixel SP provided on the substrate 10. That is, the black matrix 410 may be directly provided on the encapsulation layer 300 overlapping a light blocking area other than an opening area overlapping an organic light emitting device ED of each pixel SP, thereby preventing color mixture between adjacent opening areas. The black matrix 410 according to an embodiment may include a plurality of first light blocking patterns which cover a plurality of gate lines and a pixel circuit PC of each pixel SP, a plurality of second light blocking patterns which cover a plurality of data lines and a plurality of pixel driving power lines, and a third blocking pattern which covers an edge of the encapsulation layer 300.

The color filter layer 430 may be directly provided on a top of the encapsulation layer 300 overlapping the opening area defined by the black matrix 410 and may include a red color filter, a green color filter, and a blue color filter which respectively correspond to colors respectively defined in the plurality pixels SP. The color filter layer 430 may transmit only light, having a wavelength of a color corresponding to a certain pixel SP, in white light emitted from the certain pixel SP.

The buffer layer 450 may cover the black matrix 410 and the color filter layer 430. The buffer layer 450 may provide a planar surface on the black matrix 410 and the color filter layer 430.

Except that a plurality of first touch electrodes TE1 and a plurality of second touch electrodes TE2 included in the first touch electrode layer 510 are directly coupled to the top of the buffer layer 450, the touch sensing layer 500 may have the same configuration as that of the touch sensing layer illustrated in FIGS. 1 to 3, and thus, its detailed description is not repeated.

In addition, the buffer layer 450 may support the touch sensing layer 500 and may protect the color filter layer 430 in a process of manufacturing the touch sensing layer 500. The buffer layer 450 according to an embodiment may be formed to have a thickness between 500 Å and 5 μm, and may maintain, as a minimum of 5 μm, a separation distance between a cathode electrode CE and each of the electrodes TE1 and TE2 of the first touch electrode layer 510 of the touch sensing layer 500. Therefore, in the present embodiment, a parasitic capacitance generated between the cathode electrode CE and each of the electrodes TE1 and TE2 of the first touch electrode layer 510 is minimized, thereby preventing a mutual influence caused by coupling between the cathode electrode CE and each of the electrodes TE1 and TE2 of the first touch electrode layer 510. If the separation distance between the cathode electrode CE and each of the electrodes TE1 and TE2 of the first touch electrode layer 510 is less than 5 μm, touch performance can be degraded due to the mutual influence caused by the coupling.

Moreover, the buffer layer 450 prevents a chemical solution (a developing solution, an etching solution, etc.) used in a process of manufacturing the touch sensing layer 500, external water, and/or the like from penetrating into the organic light emitting device ED, thereby preventing damage of the organic light emitting device ED. The buffer layer 450 may be formed at a low temperature of 100 C.° or less so as to prevent damage of the organic light emitting device ED vulnerable to a high temperature and may be formed of an organic insulating material having a low dielectric constant of 1 to 3. For example, the buffer layer 450 may include an acryl-based material, an epoxy-based material, or a siloxane-based material. The buffer layer 450 including an organic insulating material may have a planarization function, thereby preventing a crack from occurring in the electrodes of the touch sensing layer 500 and the encapsulation layer 300 when bending the organic light emitting display device.

Except that the plurality of first touch electrodes TE1 and the plurality of second touch electrodes TE2 included in the first touch electrode layer 510 are directly coupled to the top of the buffer layer 450, the touch sensing layer 500 has the same configuration as that of the touch sensing layer illustrated in FIGS. 1 to 3, and thus, its detailed description is not provided.

The cover window 700 may be coupled to a top of the touch sensing layer 500 by the optical adhesive member 600. The cover window 700 is the same as the cover window illustrated in FIGS. 1 to 3, and thus, its detailed description is not repeated.

The touch driving circuit 900 may be connected to the plurality of first touch electrodes TE1, the plurality of second touch electrodes TE2, and the plurality of third touch electrodes TE3. That is, the touch driving circuit 900 has the same configuration as that of the touch driving circuit illustrated in FIG. 2, and thus, its detailed description is not repeated.

In addition, the organic light emitting display device according to the present embodiment may further include a function layer disposed between the touch sensing layer 500 and the cover window 700. The function layer has the same configuration as that of the function layer 520 illustrated in FIG. 8, and thus, its detailed description is not repeated.

Optionally, each of the first touch electrode layer 510 and the second touch electrode layer 530 may be provided in plurality, and the plurality of first touch electrode layers 510 and second touch electrode layers 530 may be exchanged in their disposed positions. That is, the first touch electrode layer 510 may include the plurality of third touch electrodes TE3 directly provided on the top of the buffer layer 450, and the second touch electrode layer 530 may include the plurality of first touch electrodes TE1 and the plurality of second touch electrodes TE2 directly provided on a top of the pressure reaction member 550. Here, similarly to FIG. 10, the plurality of third touch electrodes TE3 directly provided on the top of the buffer layer 450 may be configured as one third touch electrode TE3.

The organic light emitting display device according to the present embodiment provides the same effects as those of the organic light emitting display device illustrated in FIGS. 1 to 5B, and the organic light emitting devices ED of respective pixels SP may be configured in the same structure. Accordingly, a manufacturing process is simplified, and the organic light emitting devices ED are prevented from being damaged by the buffer layer 450 in a process of manufacturing the touch sensing layer 500.

Figure 17:
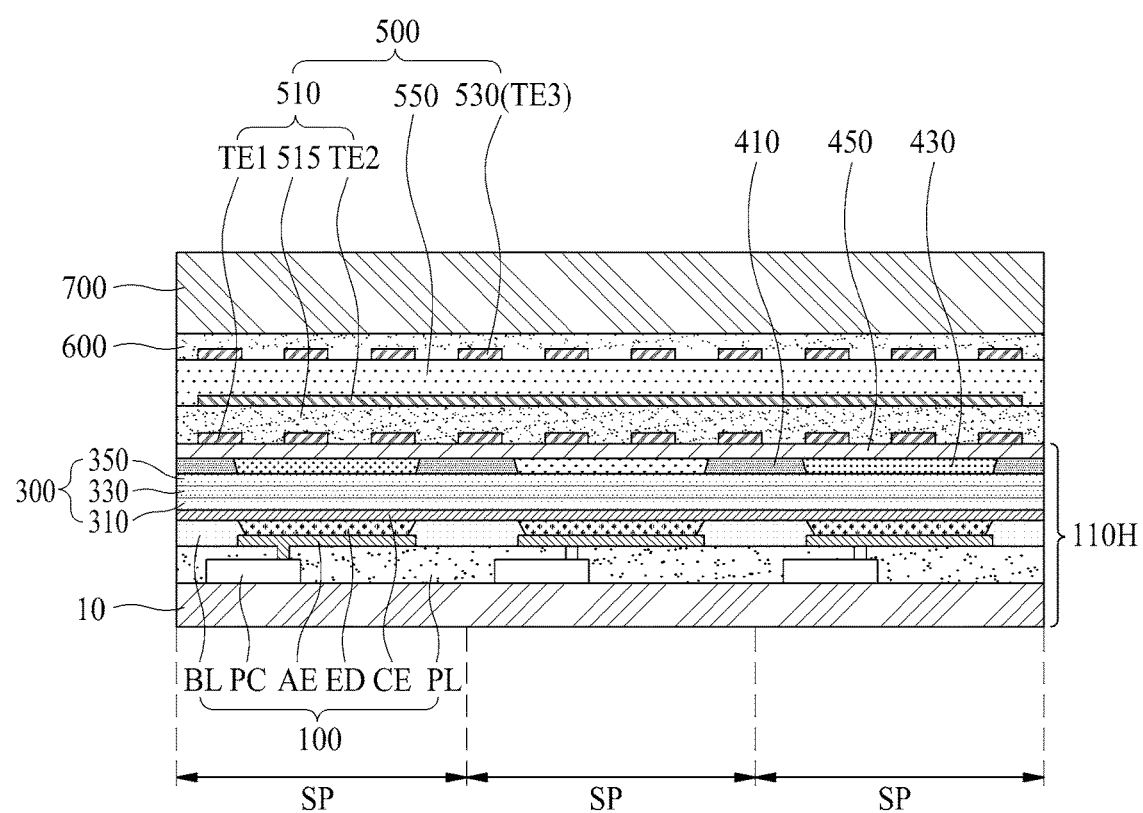
FIG. 17 is a cross-sectional view for describing an organic light emitting display device according to another embodiment.

FIG. 17 is a cross-sectional view for describing an organic light emitting display device according to another embodiment and is configured by adding a black matrix, a color filter layer, and a buffer layer to the organic light emitting display device illustrated in FIG. 11.

Referring to FIG. 17, the organic light emitting display device according to the present embodiment may include (i) a display layer 100H including a substrate 10, a pixel array layer 100, an encapsulation layer 300, a black matrix 410, a color filter layer 430, and a buffer layer 450, (ii) a touch sensing layer 500, (iii) an optical adhesive member 600, (iv) a cover window 700, and (v) a touch driving circuit 900.

Except that the organic light emitting device ED of each pixel SP provided in the pixel array layer 100 emits white light in the organic light emitting display device illustrated in FIG. 12, the substrate 10, the pixel array layer 100, and the encapsulation layer 300 are the same as the illustration in FIG. 12, and thus, their detailed descriptions are not repeated.

The black matrix 410, the color filter layer 430, and the buffer layer 450 may be provided between the encapsulation layer 300 and the touch sensing layer 500 and are the same as the illustration in FIG. 16, and thus, their detailed descriptions are not repeated.

The touch sensing layer 500 may be directly provided on a top of the buffer layer 450. Except that the touch sensing layer 500 is directly provided on the top of the buffer layer 450, the touch sensing layer 500 may have the same configuration as that of the touch sensing layer illustrated in FIGS. 11 to 13, and thus, its detailed description is not repeated.

The cover window 700 may be coupled to a top of the touch sensing layer 500 by the optical adhesive member 600 and may include a second touch electrode layer 530 of the touch sensing layer 500. The cover window 700 is the same as the cover window illustrated in FIGS. 1 to 3, and thus, its detailed description is not repeated.

The touch driving circuit 900 may be connected to a plurality of first touch electrodes TE1, a plurality of second touch electrodes TE2, and a plurality of third touch electrodes TE3. That is, the touch driving circuit 900 has the same configuration as that of the touch driving circuit illustrated in FIG. 2, and thus, its detailed description is not repeated.

In addition, the organic light emitting display device according to the present embodiment may further include a function layer disposed between the touch sensing layer 500 and the cover window 700. The function layer has the same configuration as that of the function layer 520 illustrated in FIG. 15, and thus, its detailed description is not repeated.

Optionally, the plurality of first touch electrodes TE1 and the plurality of third touch electrodes TE3 may be exchanged in their disposed positions. In this case, similarly to FIG. 10, the plurality of third touch electrodes TE3 directly provided on the top of the buffer layer 450 may be configured as one third touch electrode TE3.

Figure 18:
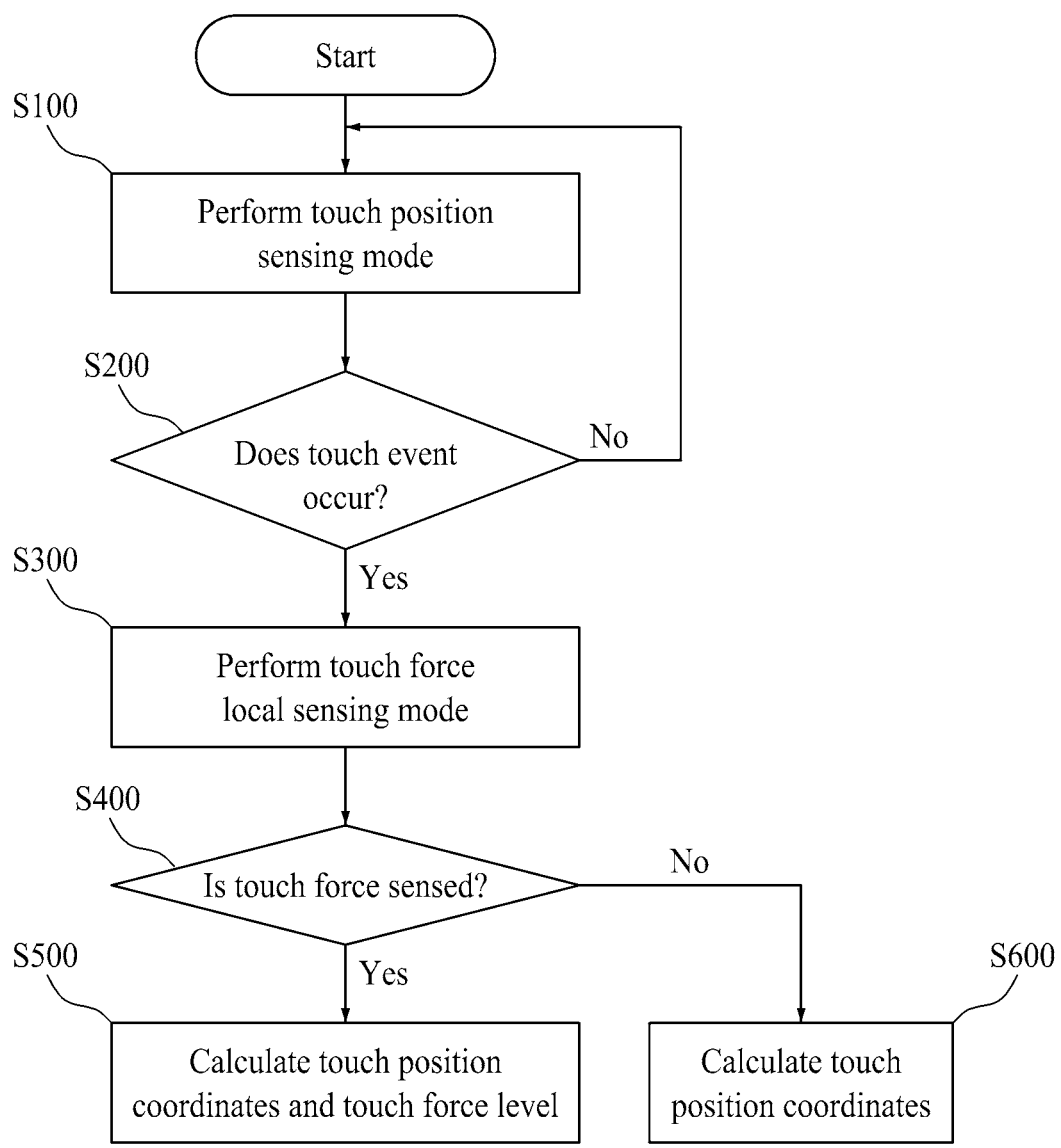
FIG. 18 is a flowchart for describing a touch sensing method performed by an organic light emitting display device according to an embodiment.

FIG. 18 is a flowchart for describing a touch sensing method performed by an organic light emitting display device according to an embodiment.

The touch sensing method performed by the organic light emitting display device according to an embodiment will be described in detail with reference to FIGS. 18 and 1 to 8.

First, in operation S100, the touch driving circuit 900 may perform the touch position sensing during the first touch sensing period. In detail, during the first touch sensing period, as illustrated in FIG. 5A, the touch driving circuit 900 may electrically float the plurality of third touch electrodes TE3 and the plurality of first and second secondary electrodes SE1 and SE2, apply the first touch driving pulse TDP1 to at least one of the plurality of first touch electrodes TE1, and sense a mutual capacitance variation, caused by a touch of a user, of the touch sensor TS provided in the pressure reaction member 550 between the first touch electrode TE1 and the second touch electrode TE2, through the plurality of second touch electrodes TE2 to generate the first touch sensing signal.

Subsequently, in operation S200, the touch driving circuit 900 may determine whether a touch event occurs, based on the first touch sensing signal generated through sensing during the first touch sensing period.

When the touch event does not occur ("NO" at S200) in operation S200, the touch driving circuit 900 may again perform the touch position sensing in operation S100.

When the touch event occurs ("YES" at S200) in operation S200, the touch driving circuit 900 may calculate a touch event area, based on the first touch sensing signal and may perform a touch force local sensing during the second touch sensing period, based on the touch event area in operation S300. In detail, as illustrated in FIG. 5B, during the second touch sensing period, the touch driving circuit 900 may electrically float the plurality of first touch electrodes TE1, electrically connect each of the plurality of first and second secondary electrodes SE1 and SE2 to the third touch electrode TE3 adjacent thereto, apply the second touch driving pulse TDP2 to at least one third touch electrode TE3 provided in the touch event area, and sense a voltage variation (or a resistance variation), caused by a touch force of a user, of the force sensor FS, provided in the pressure reaction member 550 between the second touch electrode TE2 and the third touch electrode TE3, through the plurality of second touch electrodes TE2 to generate the second touch sensing signal.

Subsequently, in operation S400, the touch driving circuit 900 may determine whether a touch force is sensed, based on the second touch sensing signal generated through sensing during the second touch sensing period.

When the touch force is sensed in the touch event area ("YES" at S400) in operation S400, the touch driving circuit 900 may calculate touch position coordinates corresponding to the touch event area and a touch force level based on the second touch sensing signal and may supply the touch position coordinates and the touch force level to the host control circuit in operation S500. Therefore, the host control circuit may execute an application which corresponds to the touch position coordinates and the touch force level supplied from the touch driving circuit 900.

When the touch force is not sensed in the touch event area ("NO" at S400) in operation S400, the touch driving circuit 900 may calculate touch position coordinates corresponding to the touch event area and may supply the touch position coordinates to the host control circuit in operation S600. Therefore, the host control circuit may execute an application corresponding to the touch position coordinates supplied from the touch driving circuit 900.

The touch sensing method performed by the organic light emitting display device according to an embodiment will be described in detail with reference to FIGS. 18 and 11 to 17.

First, in operation S100, the touch driving circuit 900 may perform the touch position sensing during the first touch sensing period. In detail, during the first touch sensing period, as illustrated in FIG. 14A, the touch driving circuit 900 may electrically float the plurality of third touch electrodes TE3 and the plurality of first and second secondary electrodes SE1 and SE2, apply the first touch driving pulse TDP1 to at least one of the plurality of first touch electrodes TE1, and sense a mutual capacitance variation, caused by a touch of a user, of the touch sensor TS provided in the pressure reaction member 550 between the first touch electrode TE1 and the second touch electrode TE2, through the plurality of second touch electrodes TE2 to generate the first touch sensing signal.

Subsequently, in operation S200, the touch driving circuit 900 may determine whether a touch event occurs, based on the first touch sensing signal generated through sensing during the first touch sensing period.

When the touch event does not occur ("NO" at S200) in operation S200, the touch driving circuit 900 may again perform the touch position sensing in operation S100.

When the touch event occurs ("YES" at S200) in operation S200, the touch driving circuit 900 may calculate a touch event area, based on the first touch sensing signal and may perform a touch force local sensing during the second touch sensing period, based on the touch event area in operation S300. In detail, as illustrated in FIG. 14B, during the second touch sensing period, the touch driving circuit 900 may electrically float the plurality of first touch electrodes TE1, connect each of the plurality of first and second secondary electrodes SE1 and SE2 to the second touch electrode TE2 adjacent thereto, apply the second touch driving pulse TDP2 to at least one of the plurality of third touch electrodes TE3 provided in the touch event area, and sense a voltage variation (or a resistance variation), caused by a touch force of a user, of the force sensor FS provided in the pressure reaction member 550 between the second touch electrode TE2 and the third touch electrode TE3, through the plurality of second touch electrodes TE2 to generate the second touch sensing signal.

Subsequently, in operation S400, the touch driving circuit 900 may determine whether a touch force is sensed, by using a touch position calculation algorithm based on the second touch sensing signal generated through sensing during the second touch sensing period.

When the touch force is sensed in the touch event area ("YES" at S400) in operation S400, the touch driving circuit 900 may calculate touch position coordinates corresponding to the touch event area and a touch force level by using a touch force level calculation algorithm based on the second touch sensing signal and may supply the touch position coordinates and the touch force level to the host control circuit in operation S500. Therefore, the host control circuit may execute an application which corresponds to the touch position coordinates and the touch force level supplied from the touch driving circuit 900.

When the touch force is not sensed in the touch event area ("NO" at S400) in operation S400, the touch driving circuit 900 may calculate touch position coordinates corresponding to the touch event area and may supply the touch position coordinates to the host control circuit in operation S600. Therefore, the host control circuit may execute an application corresponding to the touch position coordinates supplied from the touch driving circuit 900.

The organic light emitting display device according to the embodiments may be used as a display screen of one of an electronic notebook, an e-book, a portable multimedia player (PMP), a navigation device, an ultra-mobile personal computer (UMPC), a mobile phone, a smartwatch, a tablet PC, a watch phone, a wearable device, a mobile communication terminal, a televisions (TV), a notebook computer, and a monitor.

As described above, the organic light emitting display device according to the embodiments may include a touch panel and may have a thin thickness. Also, the organic light emitting display device according to the embodiments may sense a touch position and a touch force, thereby increasing an efficiency of touch force sensing.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. An organic light emitting display device comprising:
 a display layer comprising:
  a substrate,
  a pixel array layer on the substrate, the pixel array layer including a plurality of pixels, each of the plurality of pixels including a thin film transistor (TFT) and an organic light emitting diode, and
  an encapsulation layer covering the pixel array layer;
 a cover window; and
 a touch sensing layer directly disposed on the display layer, the touch sensing layer disposed between the display layer and the cover window, the touch sensing layer comprising:
  a first touch electrode layer directly on the display layer,
  a second touch electrode layer between the first touch electrode layer and the cover window, and
  a pressure reaction member between the first touch electrode layer and the second touch electrode layer, wherein the electrical characteristic of the pressure reaction member changes according to force applied to the pressure reaction member,
 wherein the second touch electrode layer further comprises a plurality of third touch electrodes disposed on the pressure reaction member and a plurality of first secondary electrodes and a plurality of second secondary electrodes disposed along the plurality of third touch electrodes, each of the plurality of third touch electrodes disposed between an adjacent one of the first secondary electrodes and an adjacent one of the second secondary electrodes,
 wherein the plurality of third touch electrodes, the plurality of first secondary electrodes, and the plurality of second secondary electrodes are electrically floated during a touch position sensing period, and
 wherein each of the plurality of third touch electrodes is electrically connected to the adjacent one of the first secondary electrodes and the adjacent one of the second secondary electrodes during a touch force sensing period.

2. The organic light emitting display device of claim 1, further comprising:
a touch driving circuit configured to determine force of a touch on the cover window according to a change in the electrical characteristic of the pressure reaction member associated with the touch, wherein the change in the electrical characteristic of the pressure reaction member is a change in a capacitance of the pressure reaction member or a change in a resistance of the pressure reaction member.

3. The organic light emitting display device of claim 1, wherein the pressure reaction member comprises a piezoelectric material or a piezoresistive material.

4. The organic light emitting display device of claim 3, wherein the piezoelectric material comprises at least one of lead zirconate titanate (PZT), $BaTiO_3$, polyvinylidene difluoride (PVDF), and parylene-C.

5. The organic light emitting display device of claim 3, wherein the piezoresistive material comprises a polymer and a conductive filler.

6. The organic light emitting display device of claim 5, wherein the conductive filler comprises at least one of nickel (Ni), copper (Cu), silver (Ag), aluminum (Al), iron (Fe), vanadium oxide ($V_2O_3$), titanium oxide (TiO), carbon black, graphite, graphene, and carbon nano tube (CNT).

7. The organic light emitting display device of claim 1,
wherein the display layer further comprises a barrier film disposed between the encapsulation layer and the first touch electrode layer,
wherein the first touch electrode layer comprises a plurality of first touch electrodes and a plurality of second touch electrodes directly on the barrier film, and
wherein the second touch electrode layer comprises a plurality of third touch electrodes disposed on the pressure reaction member.

8. The organic light emitting display device of claim 1, wherein the display layer further comprises:
a light control film disposed between the encapsulation layer and the first touch electrode layer,
wherein the first touch electrode layer comprises a plurality of first touch electrodes and a plurality of second touch electrodes directly on the light control film, and
wherein the second touch electrode layer comprises a plurality of third touch electrodes disposed on the pressure reaction member.

9. An organic light emitting display device comprising:
a display layer;
a cover window; and
a touch sensing layer directly disposed on the display layer, the touch sensing layer disposed between the display layer and the cover window, the touch sensing layer comprising:
a first touch electrode layer directly on the display layer,
a second touch electrode layer between the first touch electrode layer and the cover window, and
a pressure reaction member between the first touch electrode layer and the second touch electrode layer, electrical characteristic of the pressure reaction member changed according to force applied to the pressure reaction member,
wherein the display layer comprises:
a substrate;
a pixel array layer on the substrate, the pixel array layer including a plurality of pixels, each of the plurality of pixels including a thin film transistor (TFT) and an organic light emitting diode;
an encapsulation layer covering the pixel array layer;
a black matrix directly on the encapsulation layer, the black matrix defining an opening area of each of the plurality of pixels;
a color filter layer disposed in the opening area of each of the plurality of pixels; and
a buffer layer covering the black matrix and the color filter layer,
wherein the first touch electrode layer comprises a plurality of first touch electrodes and a plurality of second touch electrodes directly on the buffer layer, and
wherein the second touch electrode layer comprises a plurality of third touch electrodes directly on the pressure reaction member.

10. The organic light emitting display device of claim 1, wherein the first touch electrode layer comprises a plurality of first touch electrodes and a plurality of second touch electrodes directly on the display layer.

11. The organic light emitting display device of claim 10, wherein the plurality of first touch electrodes, the plurality of second touch electrodes, and the plurality of third touch electrodes each comprise an amorphous transparent conductive material.

12. The organic light emitting display device of claim 9,
wherein the second touch electrode layer further comprises a plurality of first secondary electrodes and a plurality of second secondary electrodes disposed along the plurality of third touch electrodes, each of the plurality of third touch electrodes disposed between an adjacent one of the first secondary electrodes and an adjacent one of the second secondary electrodes,
wherein the plurality of third touch electrodes, the plurality of first secondary electrodes, and the plurality of second secondary electrodes are electrically floated during a touch position sensing period, and
wherein each of the plurality of third touch electrodes is electrically connected to the adjacent one of the first secondary electrodes and the adjacent one of the second secondary electrodes during a touch force sensing period.

13. The organic light emitting display device of claim 1, further comprising:
a touch driving circuit connected to the plurality of first touch electrodes, the plurality of second touch electrodes, and the plurality of third touch electrodes,
wherein, during the touch position sensing period, the touch driving circuit applies a first touch driving pulse to at least one of the first touch electrodes, senses a first touch sensing signal responsive to the first touch driving pulse through the plurality of second touch electrodes, and determines a touch event area corresponding to a touch on the cover window according to the first touch sensing signal, and
wherein, during the touch force sensing period, the touch driving circuit applies a second touch driving pulse to at least one of the third touch electrodes disposed in the touch event area, senses a second touch sensing signal responsive to the second touch driving pulse through the plurality of second touch electrodes, and determines a touch force level and a touch position coordinate of the touch according to the second touch sensing signal.

14. The organic light emitting display device of claim 13, wherein the second touch electrode layer further comprises a plurality of connection electrodes, each of the plurality of connection electrodes facing one end of a corresponding one of the third touch electrodes and electrically connecting one end of a corresponding one of the first secondary electrodes to one end of a corresponding one of the second secondary electrodes adjacent to the one of the third touch electrodes.

15. An organic light emitting display device comprising:
a display layer comprising:
a substrate,
a pixel array layer on the substrate, the pixel array layer including a plurality of pixels, each of the plurality of pixels including a thin film transistor (TFT) and an organic light emitting diode, and
an encapsulation layer covering the pixel array layer;
a cover window; and
a touch sensing layer directly disposed on the display layer, the touch sensing layer disposed between the display layer and the cover window, the touch sensing layer comprising:
a first touch electrode layer directly on the display layer,
a second touch electrode layer between the first touch electrode layer and the cover window, and
a pressure reaction member between the first touch electrode layer and the second touch electrode layer, wherein the electrical characteristic of the pressure reaction member changes according to force applied to the pressure reaction member,
wherein the first touch electrode layer comprises:
a plurality of first touch electrodes directly on the encapsulation layer,
an electrode insulation layer disposed on the encapsulation layer, the electrode insulation layer covering the plurality of first touch electrodes, and
a plurality of second touch electrodes directly on the electrode insulation layer, the plurality of second touch electrodes intersecting the plurality of first touch electrodes, and
wherein the second touch electrode layer comprises a plurality of third touch electrodes directly disposed on the pressure reaction member,
wherein the first touch electrode layer further comprises a plurality of first secondary electrodes and a plurality of second secondary electrodes disposed along the plurality of second touch electrodes, each of the plurality of second touch electrodes disposed between an adjacent one of the first secondary electrodes and an adjacent one of the second secondary electrodes,
wherein the plurality of third touch electrodes, the plurality of first secondary electrodes, and the plurality of second secondary electrodes are electrically floated during a touch position sensing period, and
wherein each of the plurality of second touch electrodes is electrically connected to the adjacent one of the first secondary electrodes and the adjacent one of the second secondary electrodes during a touch force sensing period.

16. The organic light emitting display device of claim 15, further comprising:
a touch driving circuit connected to the plurality of first touch electrodes, the plurality of second touch electrodes, and the plurality of third touch electrodes,
wherein, during the touch position sensing period, the touch driving circuit applies a first touch driving pulse to at least one first touch electrode, senses a first touch sensing signal responsive to the first touch driving pulse through the plurality of second touch electrodes, and determines a touch event area corresponding to a touch on the cover window according to the first touch sensing signal, and
wherein, during the touch force sensing period, the touch driving circuit applies a second touch driving pulse to at least one of the third touch electrodes disposed in the touch event area, senses a second touch sensing signal responsive to the second touch driving pulse through (i) the plurality of second touch electrodes, (ii) the first secondary electrodes, and (iii) the second secondary electrodes, and determines a touch force level and a touch position coordinate of the touch according to the second touch sensing signal.

17. The organic light emitting display device of claim 16, wherein the first touch electrode layer further comprises a plurality of connection electrodes, each of the plurality of connection electrodes facing one end of a corresponding one of the second touch electrodes and electrically connecting one end of a corresponding one of the first secondary electrodes to one end of a corresponding one of the second secondary electrodes adjacent to the corresponding one of the second touch electrodes.

18. An organic light emitting display device comprising:
a display layer;
a cover window; and
a touch sensing layer directly disposed on the display layer, the touch sensing layer disposed between the display layer and the cover window,
wherein the display layer comprise:
a substrate;
a pixel array layer on the substrate, the pixel array layer including a plurality of pixels, each of the plurality of pixels including a thin film transistor (TFT) and an organic light emitting diode;
an encapsulation layer covering the pixel array layer;
a black matrix directly on the encapsulation layer, the black matrix defining an opening area of each of the plurality of pixels;
a color filter layer disposed in the opening area of each of the plurality of pixels; and
a buffer layer covering the black matrix and the color filter layer,
wherein the touch sensing layer comprise:
a first touch electrode layer directly on the buffer layer;
a second touch electrode layer between the first touch electrode layer and the cover window; and
a pressure reaction member between the first touch electrode layer and the second touch electrode layer, electrical characteristic of the pressure reaction member changed according to force applied to the pressure reaction member,
wherein the second touch electrode layer comprises a plurality of first touch electrodes and a plurality of second touch electrodes directly on the pressure reaction member, and
wherein the first touch electrode layer comprises a third touch electrode directly on the buffer layer and overlapping with all of the plurality of first and second touch electrodes.

19. The organic light emitting display device of claim 15, wherein the display layer further comprises:
a black matrix directly on the encapsulation layer, the black matrix defining an opening area of each of the plurality of pixels;
a color filter layer disposed in the opening area of each of the plurality of pixels; and a buffer layer covering the black matrix and the color filter layer;
wherein the first touch electrode layer is disposed on the buffer layer.

20. The organic light emitting display device of claim 9, wherein the pressure reaction member comprises a piezoelectric material or a piezoresistive material.

* * * * *